(12) United States Patent
Kim et al.

(10) Patent No.: US 12,380,943 B2
(45) Date of Patent: *Aug. 5, 2025

(54) NON-VOLATILE MEMORY DEVICE

(71) Applicant: Samsung Electronics Co., Ltd., Suwon-si (KR)

(72) Inventors: Changbum Kim, Suwon-si (KR); Sunghoon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/423,583

(22) Filed: Jan. 26, 2024

(65) Prior Publication Data
US 2024/0242755 A1    Jul. 18, 2024

Related U.S. Application Data

(63) Continuation of application No. 17/574,657, filed on Jan. 13, 2022, now Pat. No. 11,922,997.

(30) Foreign Application Priority Data

Jul. 6, 2021  (KR) .................. 10-2021-0088571

(51) Int. Cl.
*G11C 16/26* (2006.01)
*G11C 5/06* (2006.01)
(Continued)

(52) U.S. Cl.
CPC ............ *G11C 11/4093* (2013.01); *G11C 5/06* (2013.01); *G11C 11/4074* (2013.01);
(Continued)

(58) Field of Classification Search
CPC ... G11C 11/4093; G11C 5/06; G11C 11/4073; G11C 11/4094; G11C 11/4096; G11C 11/4099
See application file for complete search history.

(56) References Cited

U.S. PATENT DOCUMENTS 8,492,873 B1 * 7/2013 Tan .................. H10D 1/66
                                                        257/532
8,942,039 B2   1/2015 Sakurai et al.
(Continued)

FOREIGN PATENT DOCUMENTS

JP        2010199301 A     9/2010

OTHER PUBLICATIONS

Extended European Search Report issued Oct. 21, 2022 for corresponding EP Patent Application No. 22168724.7.

*Primary Examiner* — Min Huang
(74) *Attorney, Agent, or Firm* — Muir Patent Law, PLLC

(57) ABSTRACT

A non-volatile memory device includes a first semiconductor layer and a second semiconductor layer arranged in the vertical direction. A first semiconductor layer includes a plurality of memory cells, and a plurality of metal lines extending in a first direction, and including first bit lines, second bit lines, and a common source line tapping wire between the first bit lines and the second bit lines. A second semiconductor layer includes a page buffer circuit connected to the first bit lines and the second bit lines, and the page buffer circuit includes first transistors arranged below the first bit lines and electrically connected to the first bit lines, second transistors arranged below the second bit lines and electrically connected to the second bit lines, and a first guard ring arranged below and overlapped the common source line tapping wire in the vertical direction and extending in the first direction.

20 Claims, 23 Drawing Sheets

(51) Int. Cl.
    *G11C 11/4074*     (2006.01)
    *G11C 11/4093*     (2006.01)
    *G11C 11/4094*     (2006.01)
    *G11C 11/4096*     (2006.01)
    *G11C 11/4099*     (2006.01)

(52) U.S. Cl.
    CPC ...... *G11C 11/4094* (2013.01); *G11C 11/4096* (2013.01); *G11C 11/4099* (2013.01)

(56) References Cited

U.S. PATENT DOCUMENTS

| | | |
|---|---|---|
| 9,047,951 B2 | 6/2015 | Futatsuyama |
| 9,806,088 B2 | 10/2017 | Inatsuka |
| 10,937,797 B2 | 3/2021 | Seo et al. |
| 11,922,997 B2 * | 3/2024 | Kim ................ G11C 11/4096 |
| 2013/0322178 A1 | 12/2013 | He et al. |
| 2014/0084353 A1 | 3/2014 | Fukano |
| 2018/0040553 A1 * | 2/2018 | Tak ................ H10B 41/41 |
| 2019/0304991 A1 * | 10/2019 | Seo ................ H10B 41/41 |
| 2020/0066743 A1 * | 2/2020 | Furukawa ........... H10B 43/10 |

\* cited by examiner

NON-VOLATILE MEMORY DEVICE

CROSS-REFERENCE TO RELATED APPLICATION(S)

This application is a Continuation of U.S. patent application Ser. No. 17/574,657 filed on Jan. 13, 2022, which claims priority under 35 U.S.C. § 119 to Korean Patent Application No. 10-2021-0088571, filed on Jul. 6, 2021, in the Korean Intellectual Property Office, the disclosure of each of which is incorporated by reference herein in its entirety.

BACKGROUND

The inventive concept relates to a memory device, and more particularly, to a non-volatile memory device including a page buffer circuit with a guard ring.

Memory devices are used to store data and are classified into volatile memory devices and non-volatile memory devices. According to the demand for high capacity and miniaturization of non-volatile memory devices, three-dimensional (3D) memory devices in which a memory cell array and a peripheral circuit are arranged in the vertical direction have been developed. To achieve high capacity of non-volatile memory devices, the number of word lines stacked on a substrate increases, which may lead to a reduced size of a memory cell array. However, despite the reduction in the size of the memory cell array, the chip size of the non-volatile memory device may not decrease in the case where the size of the peripheral circuit below the memory cell array is not reduced.

SUMMARY

The inventive concept provides a non-volatile memory device capable of reducing a size of a chip by reducing a size of a peripheral circuit.

According to an aspect of the inventive concept, there is provided a non-volatile memory device including: a first semiconductor layer including a plurality of cell strings each having a plurality of memory cells and a plurality of metal lines arranged above the plurality of memory cells, the plurality of metal lines extending in a first direction, and the plurality of metal lines including first bit lines adjacent to each other in a second direction, second bit lines adjacent to each other in the second direction, and a common source line tapping wire between the first bit lines and the second bit lines; and a second semiconductor layer arranged below the first semiconductor layer in a vertical direction and including a page buffer circuit connected to the first bit lines and the second bit lines, wherein the page buffer circuit includes: first transistors arranged below the first bit lines in the vertical direction and electrically connected to the first bit lines; second transistors arranged below the second bit lines in the vertical direction and electrically connected to the second bit lines; and a first guard ring arranged below and overlapped the common source line tapping wire in the vertical direction and extending in the first direction. The plurality of cell strings are disposed between the first and second bit lines and a common source line. The common source line tapping wire is electrically connected to the common source line.

According to another aspect of the inventive concept, there is provided a non-volatile memory device including: a memory cell region including first channel structures, second channel structures, first bit lines connected to the first channel structures, the first bit lines extending in a first direction, and the first bit lines being adjacent to each other in a second direction, second bit lines connected to the second channel structures, the second bit lines extending in the first direction, and the second bit lines being adjacent to each other in the second direction, a metal pattern extending in the first direction between the first bit lines and the second bit lines, and a first metal pad; and a peripheral circuit region including a second metal pad, and connected to the memory cell region in a vertical direction by the first metal pad and the second metal pad, wherein the peripheral circuit region includes a page buffer circuit including first transistors arranged below the first bit lines in the vertical direction and electrically connected to the first bit lines, second transistors arranged below the second bit lines in the vertical direction and electrically connected to the second bit lines, and a first guard ring arranged below and overlapped the metal pattern in the vertical direction and extending in the first direction.

According to another aspect of the inventive concept, there is provided a non-volatile memory device including: a memory cell region including a plurality of cell strings each having a plurality of memory cells and the memory cell region including a first metal layer including a plurality of metal lines extending in a first direction, the plurality of metal lines including first bit lines adjacent to each other in a second direction, second bit lines adjacent to each other in the second direction, and a common source line tapping wire between the first bit lines and the second bit lines; and a page buffer circuit arranged below the memory cell region in a vertical direction, wherein the page buffer circuit includes a first guard ring arranged below and overlapped the common source line tapping wire in the vertical direction and extending in the first direction. The plurality of cell strings are disposed between the first and second bit lines and a common source line. The common source line tapping wire is electrically connected to the common source line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings.

Figure 1:
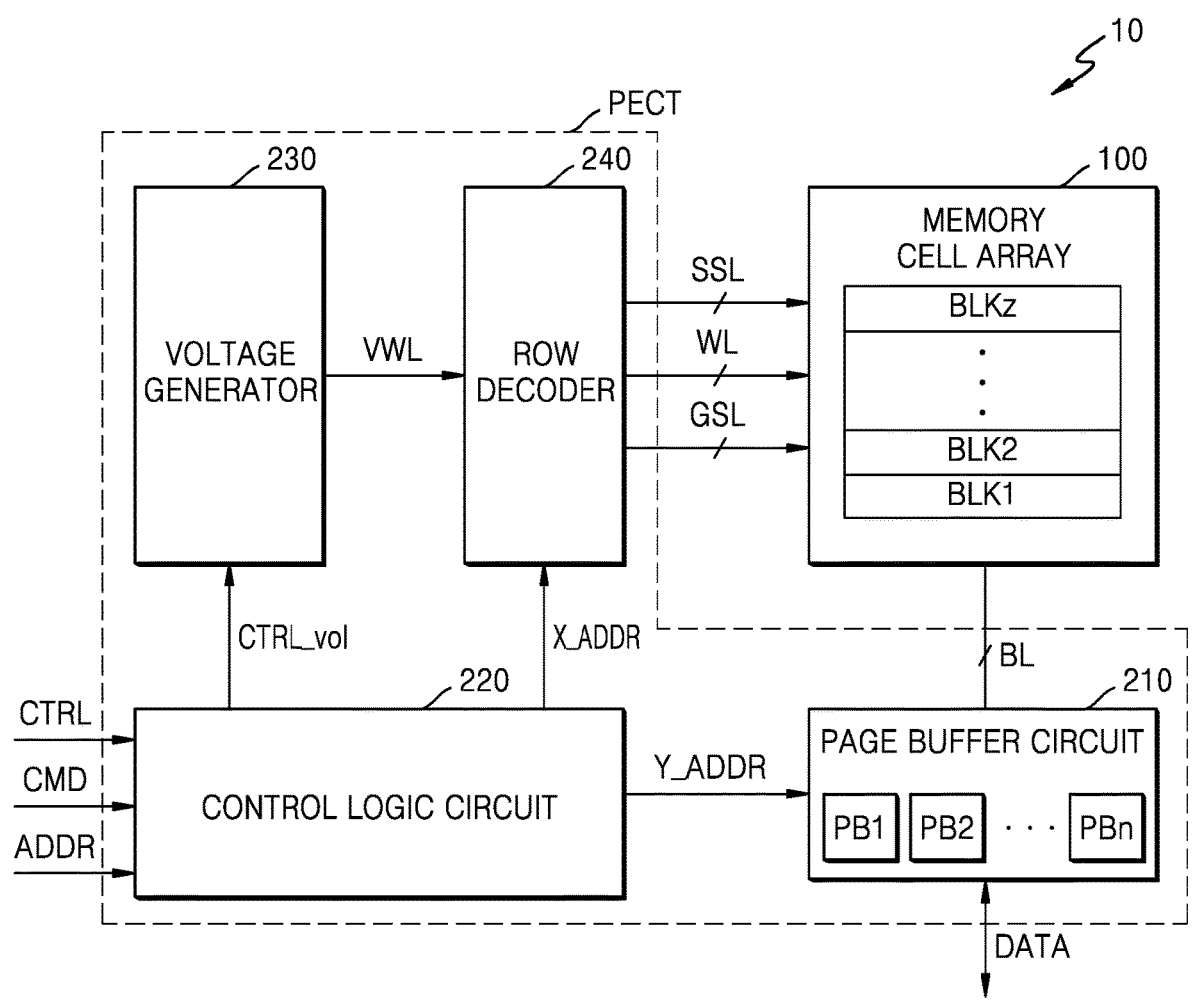
FIG. 1 is a block diagram of a memory device according to an embodiment.

FIG. 1 is a block diagram of a memory device 10 according to an embodiment.

With reference to FIG. 1, the memory device 10 may include a memory cell array 100 and a peripheral circuit PECT, and the peripheral circuit PECT may include a page buffer circuit 210, a control logic circuit 220, a voltage generator 230, and a row decoder 240. The peripheral circuit PECT may further include a data input/output circuit or an input/output interface, etc. although they are not shown in FIG. 1. In addition, the peripheral circuit PECT may further include a pre-decoder, a temperature sensor, a command decoder, an address decoder, etc. In the inventive concept, the memory device 10 may refer to a "non-volatile memory device."

The memory cell array 100 may include a plurality of memory blocks BLK1 to BLKz (z is a positive integer), and each of the plurality of memory blocks BLK1 to BLKz may include a plurality of memory cells. The memory cell array 100 may be connected to the page buffer circuit 210 through bit lines BL, and to the row decoder 240 through word lines WL, string select lines SSL, and ground select lines GSL. For example, the memory cells may be flash memory cells. Hereinafter, embodiments of the inventive concept are described in detail by taking an example in which the memory cells are NAND flash memory cells. However, the inventive concept is not limited thereto, and in some embodiments, the memory cells may be resistive memory cells, such as resistive random-access memory (ReRAM), phase change RAM (PRAM) or magnetic RAM (MRAM).

In one embodiment, the memory cell array 100 may include a three-dimensional (3D) memory cell array, the 3D memory cell array may include a plurality of NAND strings (or a plurality of cell strings), and each NAND string may include memory cells respectively connected to the word lines stacked vertically on a substrate, as described below in detail with reference to FIGS. 2, 3A and 3B. U.S. Pat. Nos. 7,679,133, 8,553,466, 8,654,587, and 8,559,235, and U.S. Patent Application Publication No. 2011/0233648 disclose proper configurations of a 3D memory cell array consisting of multiple levels among which word lines and/or bit lines are shared, and the disclosures thereof are incorporated by reference herein in their entirety. However, the inventive concept is not limited thereto, and in some embodiments, the memory cell array 100 may include a 2D memory cell array, and the 2D memory cell array may include a plurality of NAND strings arranged in row and column directions.

The page buffer circuit 210 may include a plurality of pages buffers PB1 to PBn (n is a positive integer). Each of the plurality of page buffers PB1 to PBn may be connected to the memory cells of the memory cell array 100 through a corresponding bit line. The page buffer circuit 210 may select at least one bit line of the bit lines BL according to the control by the control logic circuit 220. For example, the page buffer circuit 210 may select some bit lines of the bit lines BL in response to a column address Y-ADDR received from the control logic circuit 220.

Each of the plurality of page buffers PB1 to PBn may operate as a writing driver or a sense amplifier. For example, in a program operation, each of the plurality of page buffers PB1 to PBn may store data DATA in the memory cell by applying a voltage corresponding to the data DATA to be programmed to the bit lines. For example, in a program verify operation or a read operation, each of the plurality of page buffers PB1 to PBn may sense programmed data DATA by sensing a current or voltage through the bit lines.

The control logic circuit 220 may output various control signals to program data to the memory cell array 100, to read data from the memory cell array 100, or to erase data stored in the memory cell array 100, e.g., a voltage control signal CTRL_vol, a row address X-ADDR, and a column address Y-ADDR based on a command CMD, an address ADDR, and a control signal CTRL. In this manner, the control logic circuit 220 may generally control various operations in the memory device 10. For example, the control logic circuit 220 may receive the command CMD, the address ADDR, and the control signal CTRL from a memory controller.

The voltage generator 230 may generate various types of voltages for performing program, read, and erase operations on the memory cell array 100 based on the voltage control signal CTRL_vol. Specifically, the voltage generator 230 may generate a word line voltage VWL, for example, a program voltage, a read voltage, a pass voltage, an erase verify voltage, or a program verify voltage. In addition, the voltage generator 230 may further generate a string select line voltage and a ground select line voltage based on the voltage control signal CTRL_vol.

The row decoder 240 may select one of the plurality of memory blocks BLK1 to BLKz in response to the row address X-ADDR received from the control logic circuit 220, select one of the word lines WL of the selected memory block, and select one of the plurality of string select lines SSL. For example, when the program operation is performed, the row decoder 240 may apply a program voltage and a program verify voltage to a selected word line, and when the read operation is performed, the row decoder 240 may apply a read voltage to the selected word line.

Figure 2:
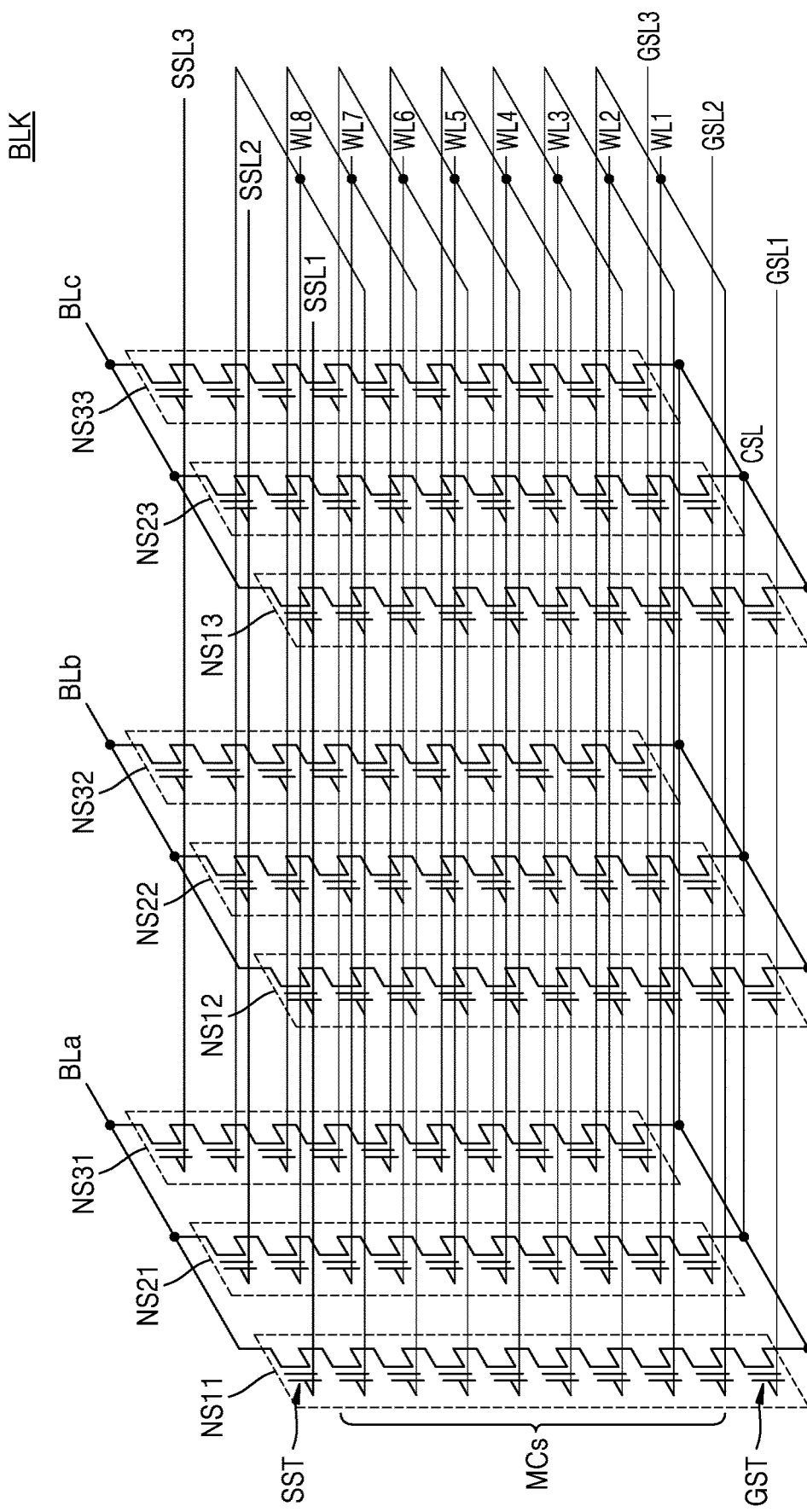
FIG. 2 is a circuit diagram of a memory block according to an embodiment.

FIG. 2 is a circuit diagram of a memory block BLK according to an embodiment.

With reference to FIG. 2, the memory block BLK may correspond to one of the plurality of memory blocks BLK1 to BLKz of FIG. 1. The memory block BLK may include NAND strings (or cell strings) NS11, NS21, NS31, NS12, NS22, NS32, NS13, NS23, and NS33, and each NAND string (e.g., NS11) may include a string select transistor SST, a plurality of memory cells MCs, and a ground select transistor GST connected in series. The string and ground transistors SST and GST and the memory cells MCs included in each NAND string may form a structure stacked in the vertical direction on a substrate.

Bit lines BLa to BLc may extend in a first direction or first horizontal direction, and word lines WL1 to WL8 may extend in a second direction or second horizontal direction. In this specification, the first horizontal direction refers to the first direction, and the second horizontal direction refers to the second direction. The NAND strings NS11, NS21, and NS31 may be arranged between the first bit line BLa and the common source line CSL, the NAND strings NS12, NS22, and NS32 may be arranged between the second bit line BLb and the common source line CSL, and the NAND strings NS13, NS23, and NS33 may be arranged between the third bit line BLc and the common source line CSL.

The string select transistor SST may be connected to a corresponding string select line among string select lines SSL1 to SSL3. The memory cells MCs may be respectively connected to corresponding word lines WL1 to WL8. The ground select transistor GST may be connected to a corresponding ground select line among ground select lines GSL1 to GSL3. The string select transistor SST may be connected to a corresponding bit line, and the ground select transistor GST may be connected to the common source line CSL. Here, the number of NAND strings, the number of word lines, the number of bit lines, the number of ground select lines, and the number of string select lines may be changed according to an embodiment.

Figure 3A:
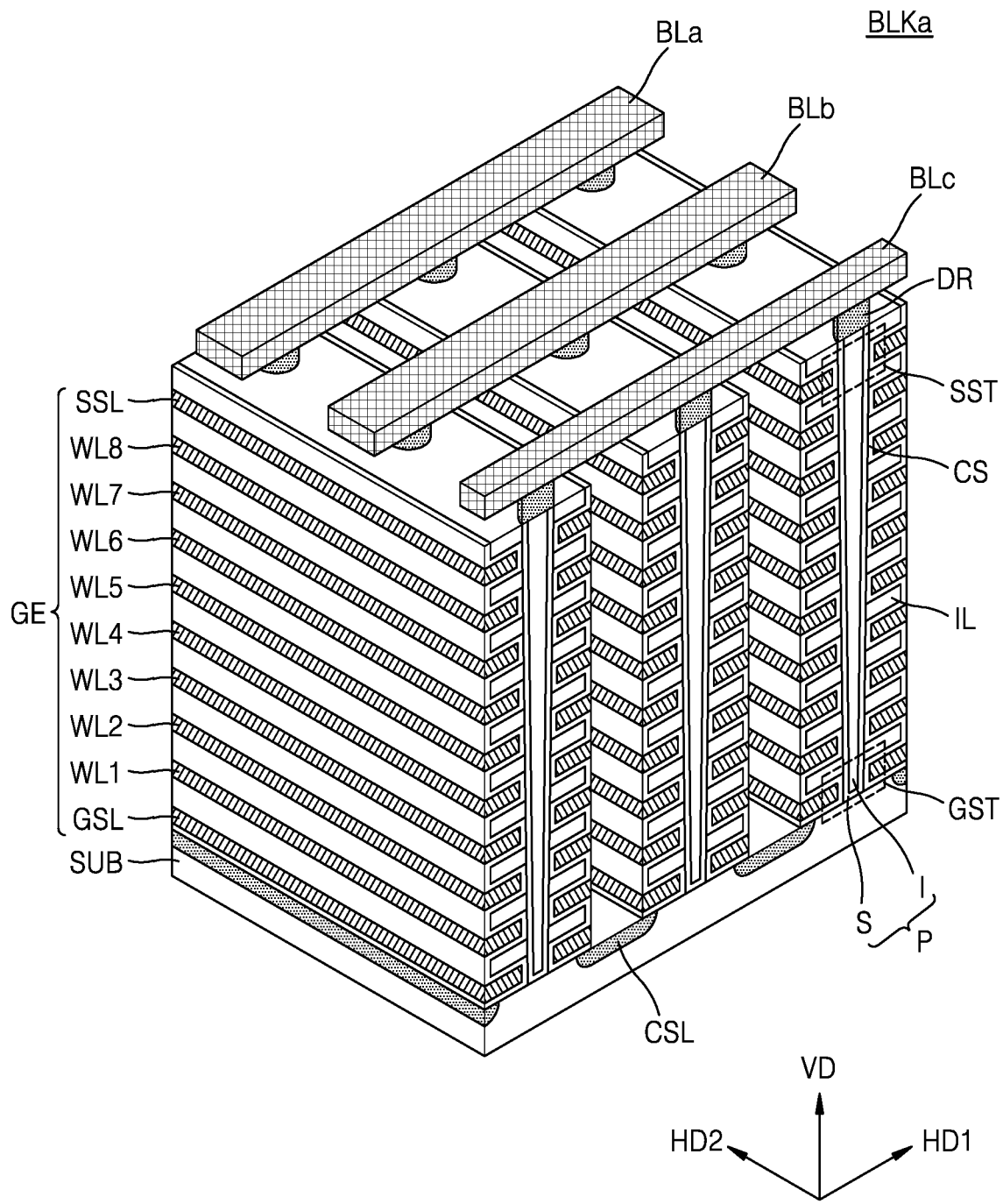
FIG. 3A is a perspective view of a memory block according to an embodiment.

FIG. 3A is a perspective view of a memory block BLKa according to an embodiment.

With reference to FIG. 3A, the memory block BLKa may correspond to one of the plurality of memory blocks BLK1 to BLKz of FIG. 1. The memory block BLKa may be formed in the vertical direction VD with respect to the substrate SUB. The substrate SUB may have a first conductivity type (e.g., P-type), and the common source line CSL extending in the second direction or second horizontal direction HD2 and doped with second conductivity type (e.g., N-type) impurities may be provided on the substrate SUB. Herein, a pattern, layer or line described as extending in a particular direction has a length in the particular direction and a width perpendicular to that direction, where the length is greater than the width. For example, the common source line CSL extending in the second direction HD2 may mean that a length of the common source line CSL extending in the second direction HD2 is greater than a width of the common source line CSL extending in the first direction HD1. In some embodiments, the common source line CLS may be implemented as a plane, or may be integrated with the substrate SUB. On an area of the substrate SUB between two adjacent common source lines CSL, a plurality of insulating films IL extending in the second horizontal direction HD2 may be provided sequentially in the vertical direction VD, and the plurality of insulating films IL may be spaced apart from each other at a certain distance in the vertical direction VD. For example, the plurality of insulating films IL may include an insulating material such as a silicon oxide.

On the area of the substrate SUB between two adjacent common source lines CSL, a plurality of pillars P arranged sequentially in the first direction or first horizontal direction HD1, and passing through the plurality of insulating films IL in the vertical direction VD may be provided. For example, the plurality of pillars P may be in contact with the substrate SUB by passing through the plurality of insulating films IL. Specifically, a surface layer S of each pillar P may include a first type silicon material and may function as a channel area. Accordingly, in some embodiments, the pillar P may be referred to as a channel structure or a vertical channel structure. In addition, an inner layer I of each pillar P may include an insulating material such as a silicon oxide or an air gap.

In the area between two adjacent common source lines CSL, a charge storage layer CS may be provided along the insulating films IL, pillars P, and an exposed surface of the substrate SUB. The charge storage layer CS may include a gate insulating layer (or a "tunneling insulating layer"), a charge trap layer, and a blocking insulating layer. For example, the charge storage layer CS may have an oxide-nitride-oxide (ONO) structure. Further, in the area between two adjacent common source lines CSL, gate electrodes GE such as the ground select lines GSL and the string selection line SSL, and word lines WL1 to WL8 may be provided on an exposed surface of the charge storage layer CS.

On the plurality of pillars P, drains or drain contacts DR may be provided. For example, the drains or drain contacts DR may include silicon materials doped with second conductivity type impurities. On the drains DR, bit lines BLa to BLc extending in the first horizontal direction HD1 and spaced apart from each other at a certain distance in the second horizontal direction HD2 may be provided.

Figure 3B:
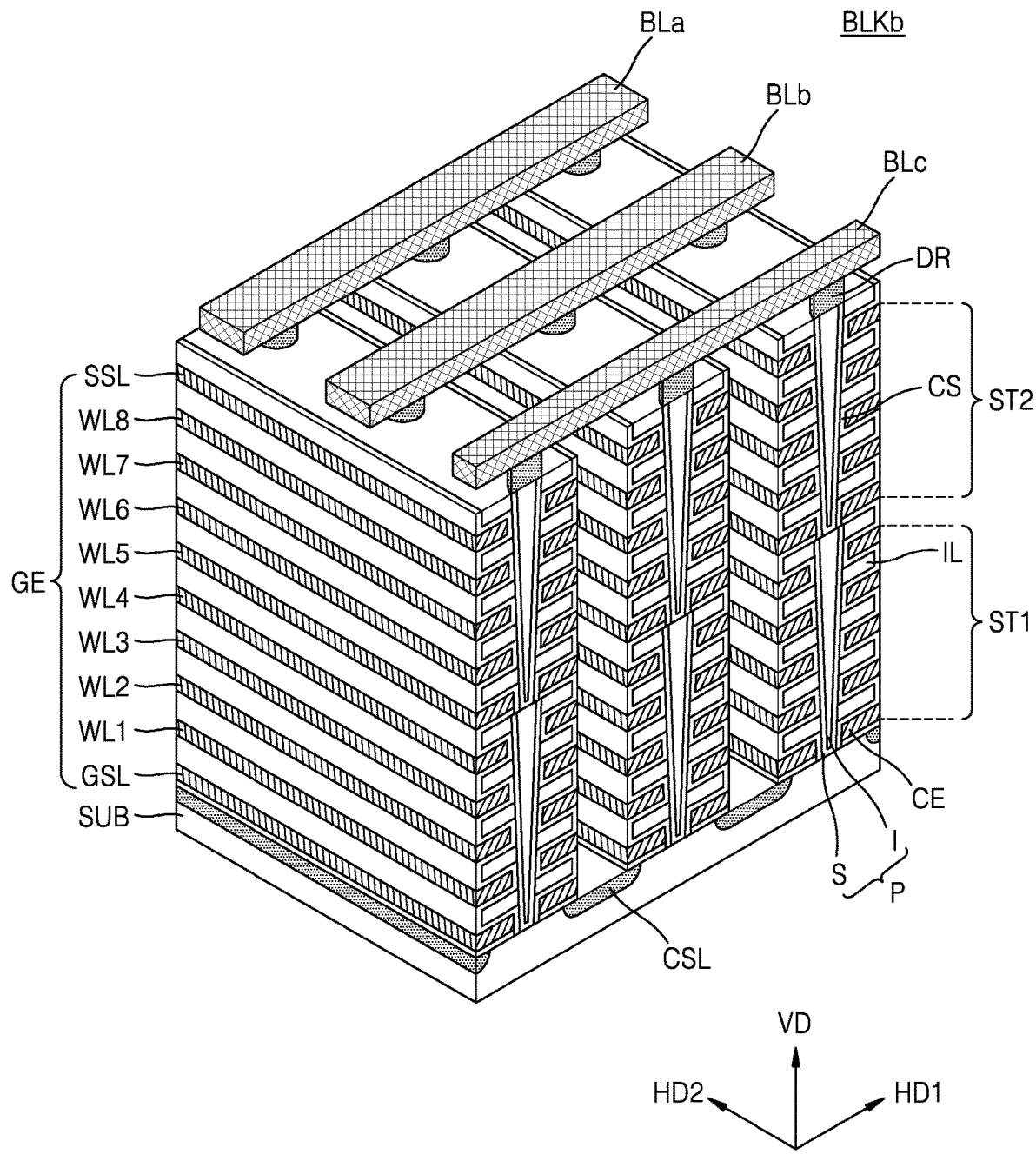
FIG. 3B is a perspective view of a memory block according to an embodiment.

FIG. 3B is a perspective view of a memory block BLKb according to an embodiment.

With reference to FIG. 3B, the memory block BLKb may correspond to one of the plurality of memory blocks BLK1 to BLKz of FIG. 1. In addition, the memory block BLKb may correspond to a various example of the memory block BLKa of FIG. 3A, and the descriptions made above with reference to FIG. 3A may be applied to this embodiment as well. The memory block BLKb may be formed in the vertical direction with respect to the substrate SUB. The memory block BLKb may include a first memory stack ST1 and a second memory stack ST2 stacked in the vertical direction VD. The first memory stack ST1 and the second memory stack ST2 may have pillars P separate from each other in the vertical direction VD.

Figure 4:
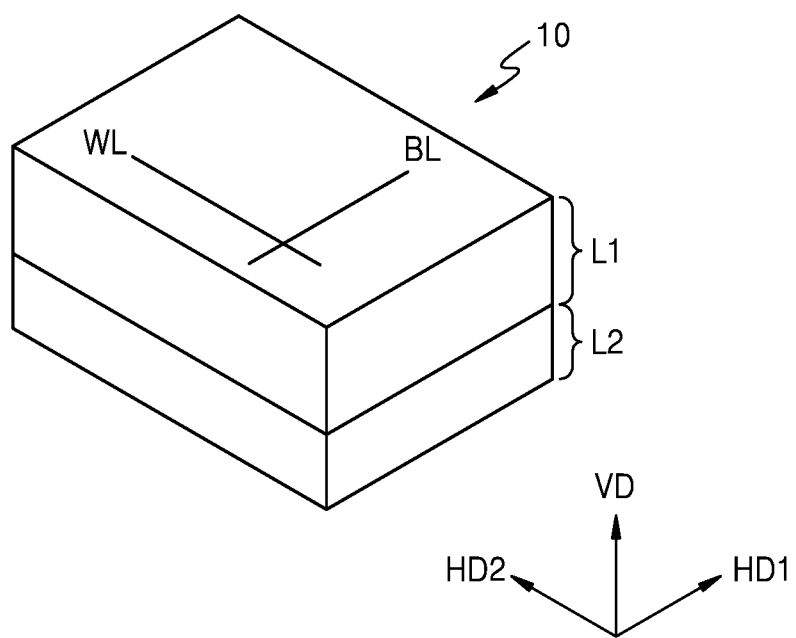
FIG. 4 is a schematic diagram of a memory device having a cell over periphery (COP) structure according to an embodiment.

FIG. 4 is a schematic diagram of a memory device 10 having a cell over periphery (COP) structure according to an embodiment.

With reference to FIG. 4, the memory device 10 may include a first semiconductor layer L1 and a second semiconductor layer L2, and the first semiconductor layer L1 may be stacked in the vertical direction VD with respect to the second semiconductor layer L2. Specifically, the second semiconductor layer L2 may be arranged below the first semiconductor layer L1 in the vertical direction VD, and accordingly, the second semiconductor layer L2 may be arranged close to the substrate.

In one embodiment, the memory cell array 100 of FIG. 1 may be formed in the first semiconductor layer L1, and the peripheral circuit PECT of FIG. 1 may be formed in the second semiconductor layer L2. Accordingly, the memory device 10 may have a structure in which the memory cell array 100 is arranged above the peripheral circuit PECT, that is, a COP structure. The COP structure may effectively reduce an area in the horizontal direction, and improve the degree of integration of the memory device 10.

In one embodiment, the second semiconductor layer L2 may include a substrate, and by forming transistors and metal patterns to wire the transistors on the substrate, the peripheral circuit PECT may be formed in the second semiconductor layer L2. After the peripheral circuit PECT is formed in the second semiconductor layer L2, the first semiconductor layer L1 including the memory cell array 100 may be formed, and metal patterns for electrically connecting the word lines WL and bit lines BL of the memory cell array 100 to the peripheral circuit PECT formed in the second semiconductor layer L2 may be formed. For example, the bit lines BL may extend in the first horizontal direction HD1, and the word lines WL may extend in the second horizontal direction HD2. For example, the memory block BLKa of FIG. 3A or the memory block BLKb of FIG. 3B may be formed in the first semiconductor layer L1.

According to the development of semiconductor processing, the higher the number of levels of the memory cells arranged in the memory cell array 100 of the first semiconductor layer L1 is, i.e., the greater the number of stacks of the word lines WL is, the less the area of the memory cell array 100 may become. Accordingly, a reduction in the area of the peripheral circuit PECT arranged below the memory cell array 100 may be needed.

Figure 5:
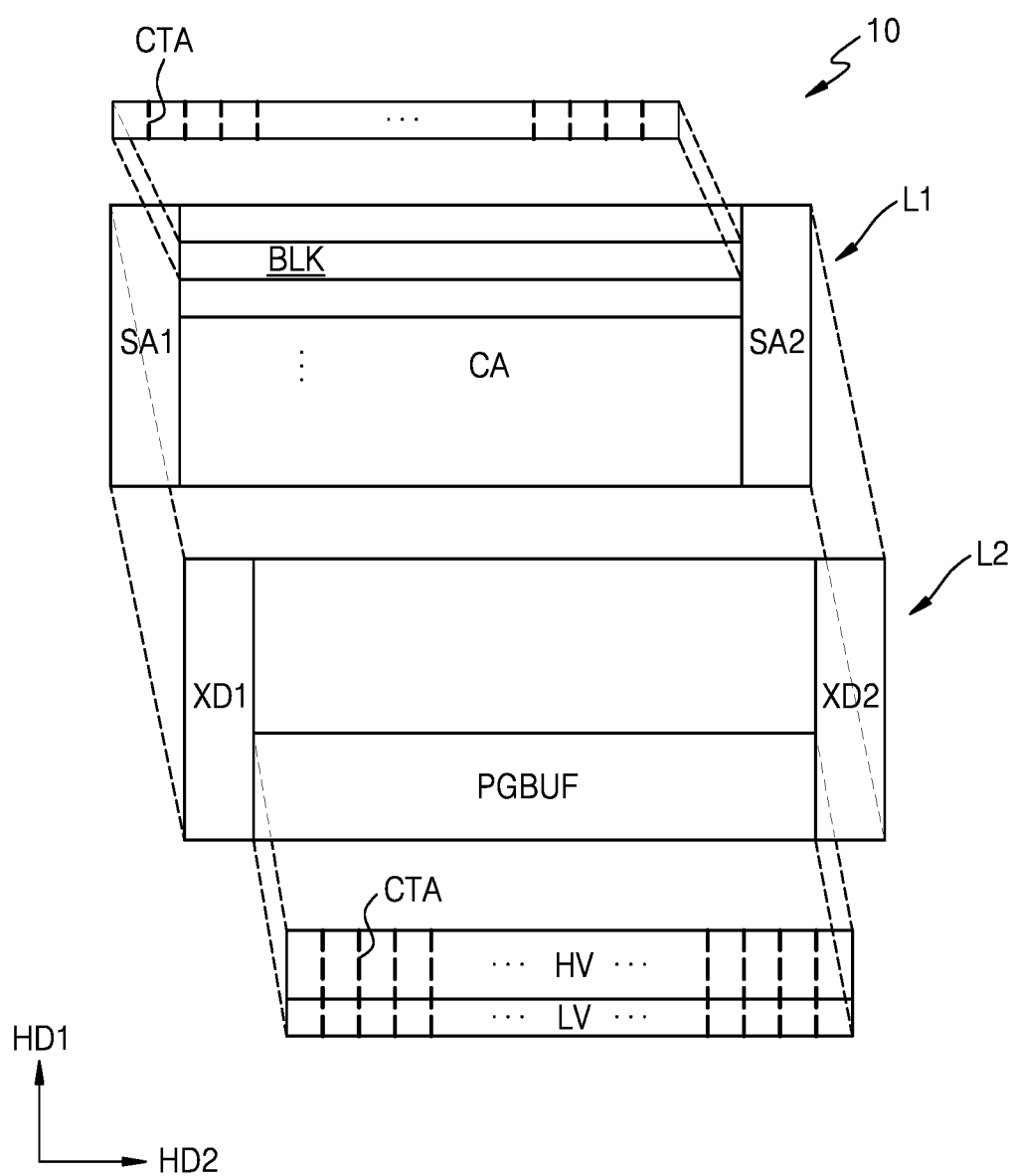
FIG. 5 is a diagram illustrating one example of a memory device according to an embodiment.

FIG. 5 is a diagram of a memory device 10 according to an embodiment.

With reference to FIG. 5, the memory device 10 may include a first semiconductor layer L1 and a second semiconductor layer L2, and the first and second semiconductor layers L1 and L2 may correspond to the first and second semiconductor layers L1 and L2 of FIG. 4, respectively. The first semiconductor layer L1 may include a cell area CA and word line stair areas SA1 and SA2, and the cell area CA and the word line stair areas SA1 and SA2 may correspond to the memory cell array 100 of FIG. 1. The second semiconductor layer L2 may include a page buffer circuit region PGBUF and row decoder regions XD1 and XD2, the page buffer circuit 210 of FIG. 1 may be arranged in the page buffer circuit region PGBUF, and the row decoder 240 of FIG. 1 may be arranged in the row decoder regions XD1 and XD2.

The first horizontal direction HD1 may correspond to the extension direction of the bit lines, and the second horizontal direction HD2 may correspond to the extension direction of the word lines. The cell area CA may include a plurality of memory blocks BLK arranged in the first horizontal direction HD1. Each memory block BLK may include a plurality of common source line tapping areas CTA extending in the first horizontal direction HD1, and a plurality of bit lines may be arranged between adjacent common source line tapping areas CTA.

The row decoder regions XD1 and XD2 of the second semiconductor layer L2 may correspond to the word line stair areas SA1 and SA2 of the first semiconductor layer L1. Further, the page buffer circuit region PGBUF of the second semiconductor layer L2 may correspond to a part of the cell area CA of the first semiconductor layer L1. In the second semiconductor layer L2, the control logic circuit 220 and the voltage generator 230 may be arranged in an area corresponding to the rest of the cell area CA of the first semiconductor layer L1 although they are not shown in the drawings.

The page buffer circuit region PGBUF may include a first region or a high voltage region HV and a second region or a low voltage region LV. The high voltage region HV and the low voltage region LV may be arranged in the first horizontal direction HD1. At this time, the page buffer circuit region PGBUF may include common source line tapping areas CTA respectively corresponding to the common source line tapping areas CTA of the cell area CA of the first semiconductor layer L1.

Figure 6:
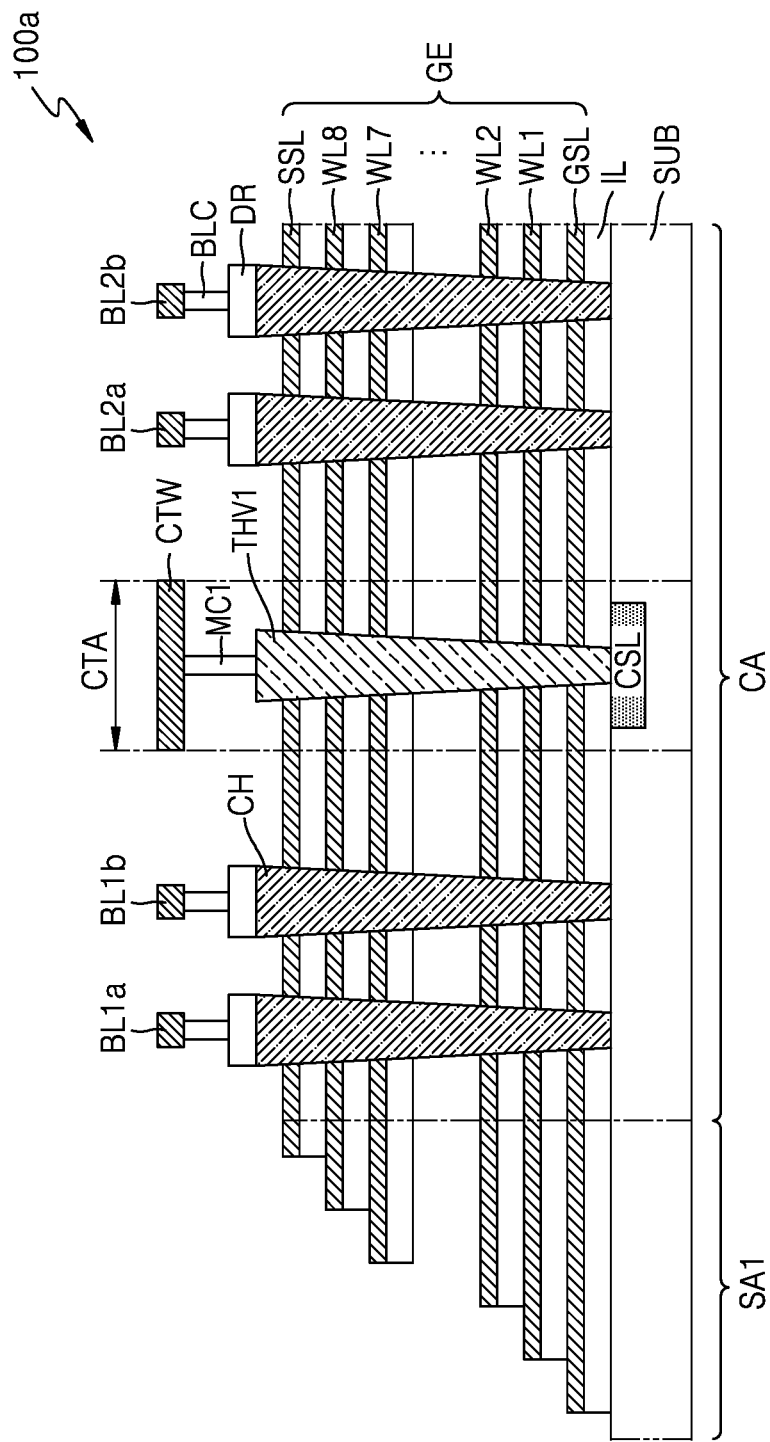
FIG. 6 is a cross-sectional diagram of a memory cell array according to an embodiment.

FIG. 6 is a cross-sectional diagram of a memory cell array 100a according to an embodiment.

With reference to FIGS. 5 and 6, the memory cell array 100a may be arranged in the first semiconductor layer L1, and include a substrate SUB, gate electrodes GE, insulating films IL, a plurality of channel structures CH, a through electrode THV1, bit lines BL1a, BL1b, BL2a, and BL2b, and a common source line tapping wire CTW. In this embodiment, the bit lines BL1a, BL1b, BL2a, and BL2b and the common source line tapping wire CTW may be arranged at the same level, and may be implemented as, for example, a first metal layer (e.g., MT1 of FIG. 7), as described below with reference to FIG. 7.

The substrate SUB may include the cell area CA and the word line stair area SAL The gate electrodes GE may be stacked on the substrate SUB in the vertical direction (e.g., VD of FIG. 4) and may be electrically insulated by the insulating films IL. The gate electrodes GE may extend in one direction, and one ends of the gate electrodes GE may be implemented in the form of stairs in the word line stair area SAL For example, the gate electrodes GE may include a ground select line GSL, a plurality of word lines WL1 to WL8, and a string select line SSL.

The plurality of channel structures CH may extend in the vertical direction (e.g., VD of FIG. 4), and may pass through the gate electrodes GE and insulating films IL. For example, the plurality of channel structures CH may correspond to the pillar P of FIG. 3A or FIG. 3B, and the descriptions made with reference to FIGS. 3A and 3B may be applied to this embodiment as well. For example, the plurality of channel structures CH may be formed annularly. However, the inventive concept is not limited thereto, and the plurality of channel structures CH may be formed in the form of an elliptic or rectangular cylinder. On the plurality of channel structures CH, the drains DR may be respectively provided. For example, the drains DR may include silicon materials doped with the second conductivity type (e.g., N-type) impurities. The bit lines BL1a, BL1b, BL2a, and BL2b may be provided above the drains DR, and the bit lines BL1a, BL1b, BL2a, and BL2b may be respectively connected to drains DR through bit line contacts BLC.

The through electrode THV1 may extend in the vertical direction VD, and pass through the gate electrodes GE and the insulating films IL. For example, the through electrode THV1 may be formed annularly. However, the inventive concept is not limited thereto, and the through electrode THV1 may be formed in the form of an elliptic or rectangular cylinder. The common source line tapping wire CTW may be provided above the through electrode THV1, and the common source line tapping wire CTW may be connected to the through electrode THV1 through a metal contact MC1.

The memory cell array 100a may further include the common source line CSL arranged on the substrate SUB. The common source line CSL may extend in one direction. The common source line CSL may be connected to the common source line tapping wire CTW through the through electrode THV1 and the metal contact MC1. In this inventive concept, an area in which the common source line tapping wire CTW is arranged is referred to as a "common source line tapping area CTA."

In one embodiment, the extension direction of the common source line CSL may be identical to the extension direction of the common source line tapping wire CTW, and in this case, FIG. 6 may be a cross-sectional view taken from the same side. However, the inventive concept is not limited thereto, and in some embodiments, the extension direction of the common source line CSL may be different from the extension direction of the common source line tapping wire CTW. In this case, the cross-sectional view of FIG. 6 may be a cross-sectional view of the bit lines BL1a and BL1b, the common source line tapping wire CTW, and the bit lines BL2a and BL2b taken from each different sides. Furthermore, in some embodiments, the bit lines BL1a, BL1b, BL2a, and BL2b may be arranged in zigzags.

According to some embodiments, the common source line CSL may be formed by doping the substrate SUB with impurities of second conductivity type (e.g., N-type). According to some embodiments, the common source line CSL may include tungsten or tungsten compounds. In some embodiments, the common source line CSL may be formed in a linear shape. In some embodiments, the common source line CSL may be formed in a plate shape. For example, a plate-shaped common source line CSL may be arranged below the ground select line GSL in the vertical direction. However, the inventive concept is not limited thereto, and the structure and configuration of the common source line CSL may be changed in various ways.

Although they are not shown in the drawings, a plurality of contacts may be arranged on the gate electrodes GE in the word line stair area SA1, and accordingly, the gate electrodes GE may be electrically connected to the row decoder region XD1 of the second semiconductor layer L2. Similarly, a plurality of contacts may be arranged on the gate electrodes GE in the word line stair area SA2, and accordingly, the gate electrodes GE may be electrically connected to the row decoder region XD2 of the second semiconductor layer L2.

Figure 7:
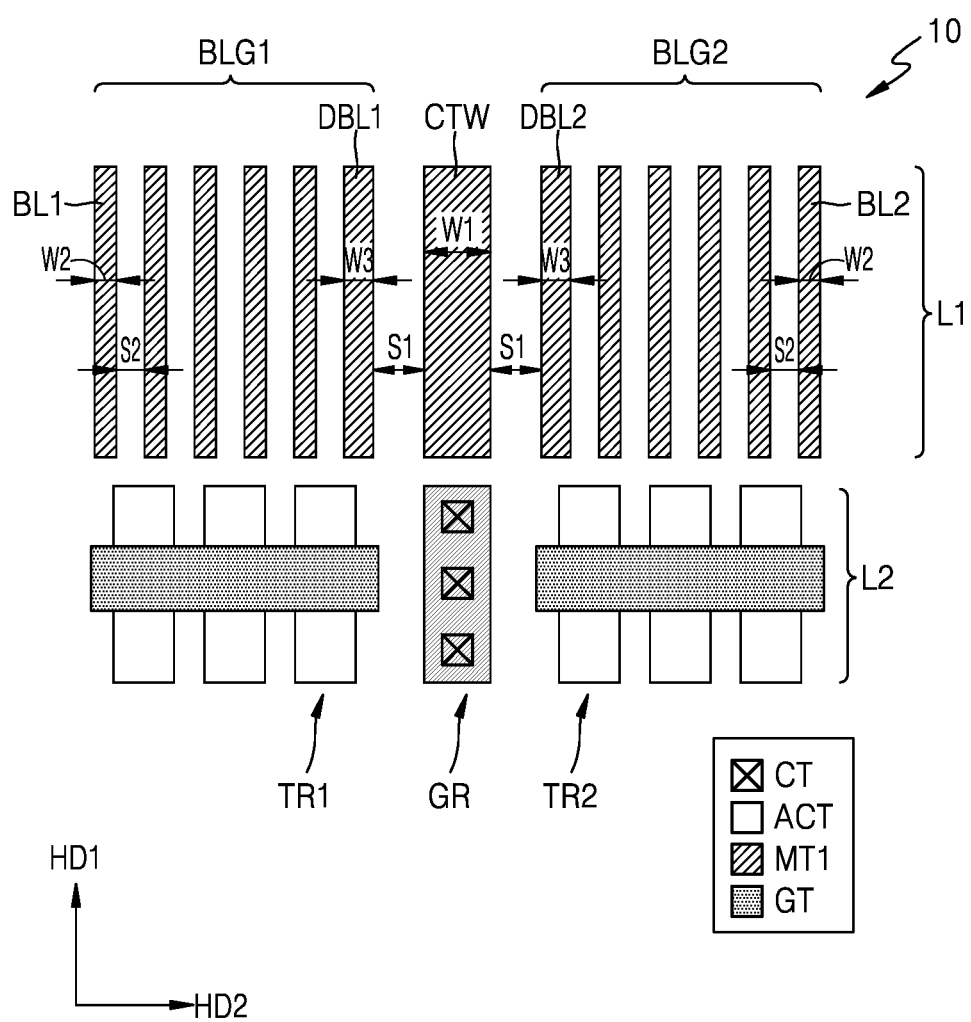
FIG. 7 is a planar view of a memory device according to an embodiment.

FIG. 7 is a planar view of a memory device 10 according to an embodiment.

With reference to FIGS. 5 to 7, a first metal layer MT1 may be arranged above the cell area CA in the first semiconductor layer L1, and the first metal layer MT1 may include a first bit line group BLG1, a second bit line group BLG2, and a common source line tapping wire CTW. The first bit line group BLG1 may include a plurality of first bit lines BL1 that extend in the first horizontal direction HD1 and are adjacent to each other in the second horizontal direction HD2. The second bit line group BLG2 may include a plurality of second bit lines BL2 that extend in the first horizontal direction HD1 and are adjacent to each other in the second horizontal direction HD2.

The common source line tapping wire CTW may extend in the first horizontal direction HD1 and be arranged between the first bit line group BLG1 and the second bit line group BLG2. A first width W1 of the common source line tapping wire CTW in the second horizontal direction HD2 may be greater than a second width W2 of each of the first bit lines BL1 and the second bit lines BL2 in the second horizontal direction HD2. For example, the first width W1 of the common source line tapping wire CTW in the second horizontal direction HD2 may be tens of times greater than the second width W2 of each of the first bit lines BL1 and the second bit lines BL2 in the second horizontal direction HD2. Also, a pitch of the common source line tapping wire CTW may be greater than a pitch of each of the first bit lines BL1 and the second bit lines BL2. The pitch of the common source line tapping wire CTW may include the first width W1 of the common source line tapping wire CTW and a first space S1 between a first dummy bit line DBL1 and the common source line tapping wire CTW or between a second dummy bit line DBL2 and the common source line tapping wire CTW. The pitch of each of the first bit lines BL1 and the second bit lines BL2 may include the second width W2 of each of the first bit lines BL1 and the second bit lines BL2 and a second space S2 between two adjacent first bit lines BL1 of the plurality of first bit lines BL1 or between two adjacent second bit lines BL2 of the plurality of second bit lines BL2. For example, the pitch of the common source line tapping wire CTW may be tens of times greater than the pitch of each of the first bit lines BL1 and the second bit lines BL2.

In one embodiment, the first bit line group BLG1 may include at least one first dummy bit line DBL1 adjacent to the common source line tapping wire CTW, and the second bit line group BLG2 may include at least one second dummy bit line DBL2 adjacent to the common source line tapping wire CTW. In one embodiment, the first space S1 between at least one first dummy bit line DBL1 and the common source line tapping wire CTW may be greater than the second space S2 between two adjacent first bit lines BL1 of the plurality of first bit lines BL1. Also, the first space S1 between at least one second dummy bit line DBL2 and the common source line tapping wire CTW may be greater than the second space S2 between two adjacent second bit lines BL2 of the plurality of second bit lines BL2. In one embodiment, a third width W3 of at least one first dummy bit line DBL1 may be greater than a second width W2 of each of the plurality of first bit lines BL1. Also, a third width W3 of at least one second dummy bit line DBL2 may be greater than a second width W2 of each of the plurality of second bit lines BL2.

The page buffer circuit of the second semiconductor layer L2 may include first transistors TR1 and second transistors TR2. The first transistors TR1 may be arranged below the first bit line group BLG1 in the vertical direction VD, and the second transistors TR2 may be arranged below the second bit line group BLG2 in the vertical direction VD. For example, each of the first and second transistors TR1 and TR2 may include an active region ACT and a gate electrode GT arranged on the active region ACT. The first transistors TR1 may be electrically connected to the plurality of first bit lines BL1 included in the first bit line group BLG1, and the second transistors TR2 may be electrically connected to the plurality of second bit lines BL2 included in the second bit line group BLG2. At this time, the first transistors TR1 may not be connected to at least one first dummy bit line DBL1 included in the first bit line group BLG1, and the second transistors TR2 may not be connected to at least one second dummy bit line DBL2 included in the second bit line group BLG2.

Further, the page buffer circuit of the second semiconductor layer L2 may further include a guard ring GR arranged between the first transistors TR1 and the second transistors TR2 and extending in the first horizontal direction HD1. In this embodiment, the guard ring GR may be arranged below the common source line tapping wire CTW in the vertical direction VD, i.e., below the common source line tapping area CTA in the vertical direction VD. For example, the guard ring GR may correspond to or include an $N^+$ active pattern or a $P^+$ active pattern. The guard ring GR may be arranged in a well. For example, the guard ring GR may include $P^+$ active pattern when the well is a P-type well, and the guard ring GR may include $N^+$ active pattern when the well is a N-type well. A plurality of contacts CT may be arranged on the guard ring GR, and a well bias voltage may be applied to the guard ring GR via the plurality of contacts CT. Accordingly, a well bias voltage may be applied to a P-well or an N-well at which the guard ring GR is arranged. For example, the well bias voltage applied to the P-well through the guard ring GR may be a ground voltage (VSS or GND) and the well bias voltage applied to the N-well through the guard ring GR may be a power voltage (VCC or VDD).

Figure 8:
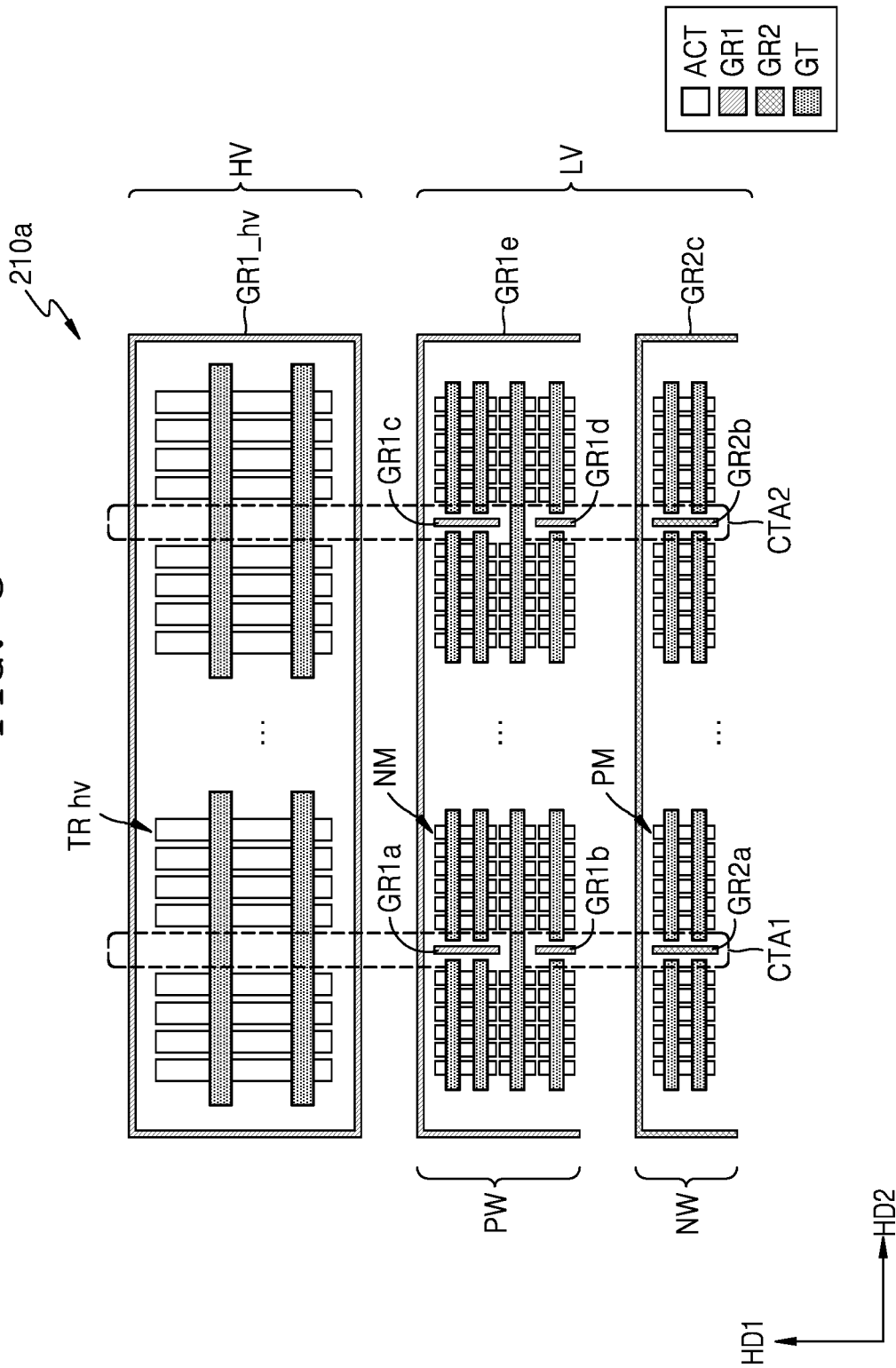
FIG. 8 is a planar view of a page buffer circuit according to an embodiment.

FIG. 8 is a planar view of a page buffer circuit 210a according to an embodiment.

With reference to FIG. 8, the page buffer circuit 210a may be arranged in the page buffer circuit region PGBUF of FIG. 5. The page buffer circuit 210a may include a high voltage region HV and a low voltage region LV. The high voltage region HV and the low voltage region LV may be adjacent to each other in the first horizontal direction HD1. For example, the high voltage region HV may correspond to a P-well region on the substrate, but the inventive concept is not limited thereto. For example, the low voltage region LV may include a first well region PW and a second well region NW on the substrate. For example, the first well region PW may correspond to a P-well having a first conductivity type (e.g., P-type), and the second well region NW may correspond to an N-well having a second conductivity type (e.g., N-type).

In the high voltage region HV, a plurality of high voltage transistors TR_hv may be arranged. For example, a high voltage transistor TR_hv may correspond to a bit line select transistor TR_hv of FIG. 9. In the low voltage region LV, a plurality of NMOS transistors NM and a plurality of PMOS transistors PM may be arranged. The plurality of NMOS transistors NM may be arranged in the first well region PW, and the plurality of PMOS transistors PM may be arranged in the second well region NW. For example, the plurality of NMOS transistors NM may correspond to first to third NMOS transistors NM1 to NM3 of FIG. 9, and the plurality of PMOS transistors PM may correspond to a first PMOS transistor PM1 of FIG. 9.

According to the present embodiment, the page buffer circuit 210a may include a first common source line tapping area CTA1 and a second common source line tapping area CTA2 corresponding to the common source line tapping area CTA of the first semiconductor layer L1. In one embodiment, in the first and second common source line tapping areas CTA1 and CTA2 of the low voltage region LV, guard rings extending in the first horizontal direction HD1 (e.g., first guard rings GR1a to GR1d and second guard rings GR2a and GR2b) may be arranged, and in the first and second common source line tapping areas CTA1 and CTA2 of the high voltage region HV, the guard rings extending in the first horizontal direction HD1 may not be arranged. However, the inventive concept is not limited thereto, and guard rings may be arranged in the first and second common source line tapping areas CTA1 and CTA2 of the high voltage region HV. In some embodiments, the guard rings extending in the first horizontal direction HD1 may be arranged only in the first and second common source line tapping areas CTA1 and CTA2 of either one of the first well region PW and the second well region NW of the low voltage region LV.

In the high voltage region HV, a first guard ring GR1_hv may be arranged along well edge regions. The well bias voltage may be applied to the well of the high voltage region HV through the first guard ring GR1_hv. At this time, no guard ring may be arranged in the first and second common source line tapping areas CTA1 and CTA2 of the high voltage region HV.

The first well region PW of the low voltage region LV may include first guard rings GR1a and GR1b arranged in the first common source line tapping area CTA1 and first guard rings GR1c and GR1d arranged in the second common source line tapping area CTA2. The first guard rings GR1a and GR1b may extend in the first horizontal direction HD1 and may be spaced apart from each other. In one embodiment, the first guard rings GR1a and GR1b may be aligned in line, but the inventive concept is not limited thereto. Similarly, the first guard rings GR1c and GR1d may extend in the first horizontal direction HD1 and may be spaced apart from each other. In one embodiment, the first guard rings GR1c and GR1d may be aligned in line, but the inventive concept is not limited thereto.

Further, the first well region PW may further include a first guard ring GR1e arranged along the edge regions of the first well region PW. In one embodiment, the first guard ring GR1e may be arranged in lateral edge regions and upper edge region of the edge regions of the first well region PW, and may not be arranged in the lower edge region adjacent to the second well region NW. As such, the guard ring may only be arranged in either the upper edge region or the lower edge region of the first well region PW, and accordingly, the size of the first well region PW in the first horizontal direction HD1 may be reduced. FIG. 8 illustrates that the first guard rings GR1a and GR1e are spaced apart from each other, but the inventive concept is not limited thereto. In some embodiments, the first guard rings GR1a and GR1e may be in contact with each other. Similarly, although FIG. 8 illustrates that the first guard rings GR1c and GR1e are spaced apart from each other, the inventive concept is not limited thereto. In some embodiments, the first guard rings GR1c and GR1e may be in contact with each other.

The second well region NW of the low voltage region LV may include a second guard ring GR2a arranged in the first common source line tapping area CTA1 and a second guard ring GR2b arranged in the second common source line tapping area CTA2. The second guard rings GR2a and GR2b may extend in the first horizontal direction HD1. Further, the second well region NW may further include a second guard ring GR2c arranged along the edge regions of the second well region NW. In one embodiment, the second guard ring GR2c may be arranged in lateral edge regions and upper edge region of the edge regions of the second well region NW, and may not be arranged in the lower edge region. As such, the guard ring may only be arranged in either the upper edge region or the lower edge region of the second well region NW, and accordingly, the size of the second well region NW in the first horizontal direction HD1 may be reduced.

Figure 9:
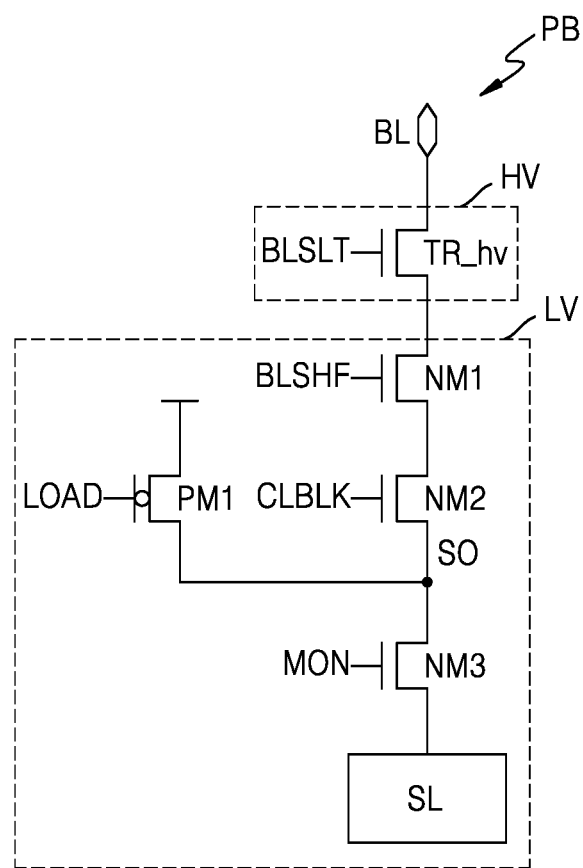
FIG. 9 is a circuit diagram of a page buffer according to an embodiment.

FIG. 9 is a circuit diagram of a page buffer PB according to an embodiment.

With reference to FIG. 9, the page buffer PB may correspond to one of the plurality of page buffers PB1 to PBn of FIG. 1. The page buffer PB may be divided into a high voltage region HV and a low voltage region LV, and the high voltage region HV and the low voltage region LV may be implemented each as different well regions. A bit line select transistor TR_hv may be arranged in the high voltage region HV, and a first NMOS transistor NM1, a second NMOS transistor NM2, a third NMOS transistor NM3, a first PMOS transistor PM1, and a sensing latch SL may be arranged in the low voltage region LV. Although they are not shown in the drawings, NMOS transistors and PMOS transistors may be further arranged in the low voltage region LV. Also, in the low voltage region LV, various latches, such as a force latch, an upper bit latch, a lower bit latch, a cash latch, etc. may be arranged.

The bit line select transistor TR_hv may be connected to the bit line BL, be driven by a bit line select signal BLSLT, and be implemented as a high voltage transistor. The first and second NMOS transistors NM1 and NM2 may be connected in series between the bit line select transistor TR_hv and a sensing node SO. The first NMOS transistor NM1 may be driven by a bit line shut-off signal BLSHF, and the second NMOS transistor NM2 may be driven by a bit line connect control signal CLBLK. The first PMOS transistor PM1 may be connected to the sensing node SO, be driven by a load signal LOAD, and precharge the sensing node SO to a precharge level in a precharge section. Accordingly, the first PMOS transistor PM1 may be referred to as a precharge transistor.

The third NMOS transistor NM3 may be connected between the sensing node SO and the sensing latch SL, and be driven by a monitoring signal MON. However, the inventive concept is not limited thereto, and the third NMOS transistor NM3 may be driven by a ground control signal SOGND. The sensing latch SL may store data stored in a memory cell or a result of sensing a threshold voltage of a memory cell in a readout or program verify operation. Also, the sensing latch SL may be used for applying a program bit line voltage or a program inhibit voltage to the bit line BL in a program operation.

Figure 10:
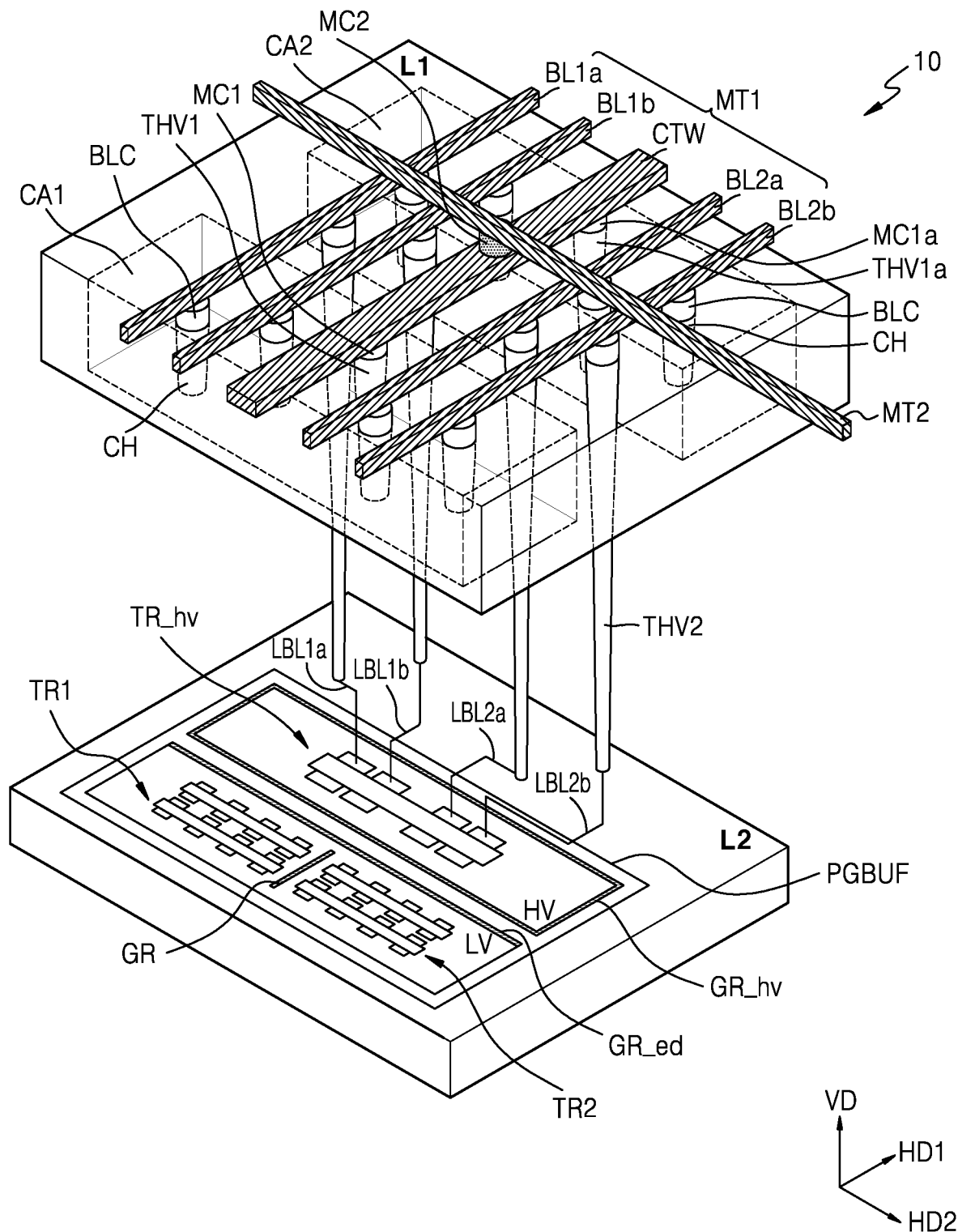
FIG. 10 is a diagram illustrating in more detail a memory device according to an embodiment.

FIG. 10 is a diagram illustrating in more detail a memory device 10 according to an embodiment.

With reference to FIGS. 6 and 10, the first metal layer MT1 including the first to fourth bit lines BL1*a*, BL1*b*, BL2*a*, and BL2*b* and the common source line tapping wire CTW may be arranged above the first semiconductor layer L1. The common source line tapping wire CTW may be connected to an upper metal layer, e.g., a second metal layer MT2, through a metal contact MC2. Although it is not shown in the drawings, each of the first to fourth bit lines BL1*a*, BL1*b*, BL2*a*, and BL2*b* may be connected to an upper metal layer, e.g., the second metal layer MT2, through a contact. For example, the first and second bit lines BL1*a* and BL1*b* may be included in the first bit line group BLG1 of FIG. 7, and the third and fourth bit lines BL2*a* and BL2*b* may be included in the second bit line group BLG2 of FIG. 7. Although it is not shown in the drawings, at least one first dummy bit line (e.g., DBL1 of FIG. 7) extending in the first horizontal direction HD1 may be further arranged between the first bit line BL1*b* and the common source line tapping wire CTW Similarly, at least one second dummy bit line (e.g., DBL2 of FIG. 7) extending in the first horizontal direction HD1 may be further arranged between the second bit line BL2*a* and the common source line tapping wire CTW.

A space between the first and second bit lines BL1*a* and BL1*b* may be narrower than a space between the second bit line BL1*b* and the common source line tapping wire CTW Similarly, a space between the third and fourth bit lines BL2*a* and BL2*b* may be narrower than a space between the third bit line BL2*a* and the common source line tapping wire CTW. A width of the common source line tapping wire CTW in the second horizontal direction HD2 may be greater than a width of each of the first to fourth bit lines BL1*a*, BL1*b*, BL2*a*, and BL2*b* in the second horizontal direction HD2.

A plurality of channel structures CH may be arranged in a first cell area CA1 and a second cell area CA2 of the first semiconductor layer L1, and the plurality of channel structures CH may be connected to the first to fourth bit lines BL1*a*, BL1*b*, BL2*a*, and BL2*b* through bit line contacts BLC. The common source line tapping wire CTW may be connected to the common source line CSL of the first cell area CA1 through the metal contact MC1 and the through electrode THV1, and be connected to the common source line CSL of the second cell area CA2 through a metal contact MC1*a* and a through electrode THV1*a*. The plurality of channel structures CH may be arranged in zigzags in the first cell area CA1. Similarly, the plurality of channel structures CH may be arranged in zigzags in the second cell area CA2.

The first to fourth bit lines BL1*a*, BL1*b*, BL2*a*, and BL2*b* may be connected to the second semiconductor layer L2 through through electrodes THV2. For example, the through electrodes THV2 may be arranged in a cutting region or a cut-off region between the first cell area CA1 and the second cell area CA2. In one embodiment, in the cut-off region, an insulating film may be arranged, and accordingly, the through electrodes THV2 may be surrounded by the insulating film. In one embodiment, the cut-off region may be an empty space. For example, the through electrodes THV2 may be arranged in zigzags.

The second semiconductor layer L2 may include first to fourth lower bit lines LBL1*a*, LBL1*b*, LBL2*a*, and LBL2*b* respectively connected to a corresponding through electrode THV2. For example, the first to fourth lower bit lines LBL1*a*, LBL1*b*, LBL2*a*, and LBL2*b* may be implemented by first to third lower metal layers and metal contacts arranged above the second semiconductor layer L2. The first to fourth lower bit lines LBL1*a*, LBL1*b*, LBL2*a*, and LBL2*b* may respectively be connected to a corresponding high voltage transistor TR_hv arranged in the high voltage region HV. The high voltage transistors TR_hv may be connected to the first and second transistors TR1 and TR2 arranged in the low voltage region LV.

The high voltage region HV may include a guard ring GR_hv arranged along the well edge regions. The low voltage region LV may include a guard ring GR extending in the first horizontal direction HD1 below the common source line tapping wire CTW. In some embodiments, the low voltage region LV may further include a guard ring GR_ed arranged along at least some parts of the well edge regions.

Figure 11:
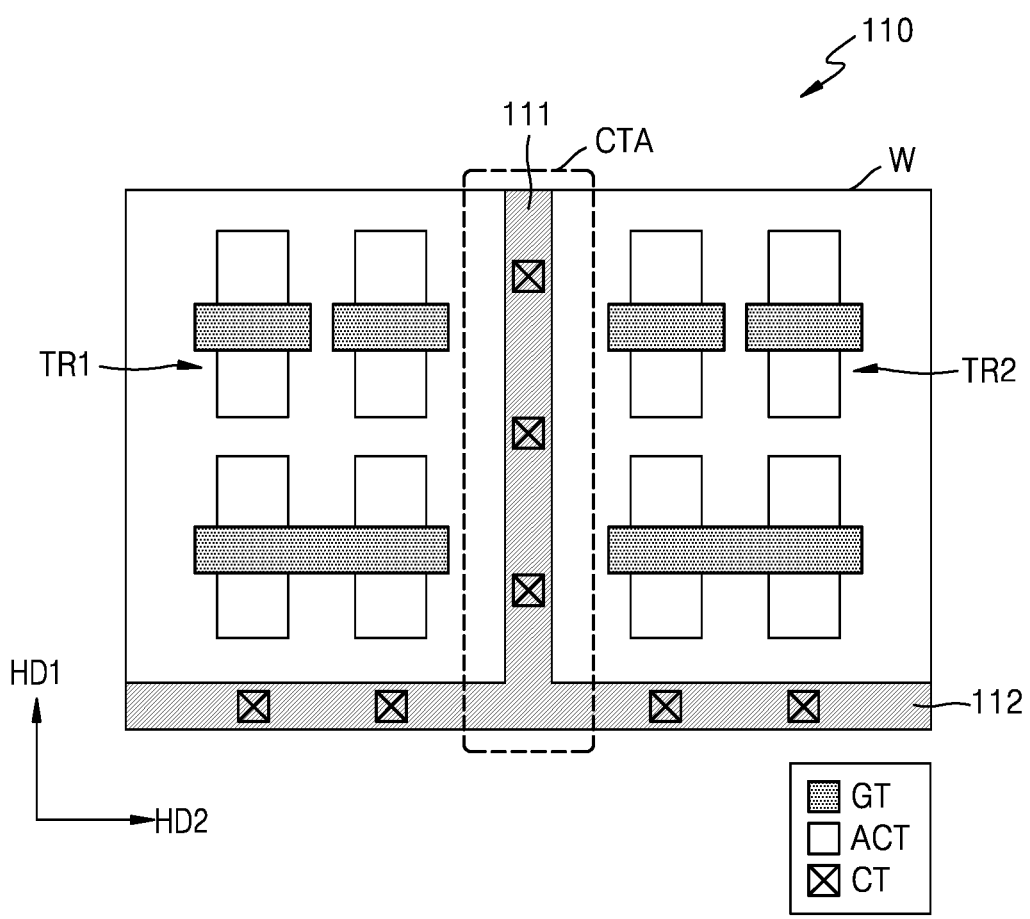
FIGS. 11 to 20 are planar views of a page buffer according to some embodiments.

FIG. 11 is a planar view of a page buffer 110 according to an embodiment.

With reference to FIG. 11, the page buffer 110 may correspond to a part of the page buffer circuit region PGBUF of the second semiconductor layer L2 of FIG. 5. The page buffer 110 may include the first transistors TR1 and the second transistors TR2 arranged in the well region W, and further include a guard ring 111 extending in the first horizontal direction HD1 and a guard ring 112 extending in the second horizontal direction HD2. The guard ring 111 may be arranged in the common source line tapping area CTA between the first transistors TR1 and the second transistors TR2. The guard ring 112 may be arranged in the lower edge region of the well region W. However, the inventive concept is not limited thereto, and the guard ring 112 may be arranged in the upper edge region of the well region W and not be arranged in the lower edge region of the well region W.

In one embodiment, the guard rings 111 and 112 may be in contact with each other, thereby forming an upside-down T shape. In one embodiment, the guard rings 111 and 112 may be spaced apart from each other. A plurality of contacts CT may be arranged on the guard rings 111 and 112, and a well bias voltage may be applied to the well region W through the plurality of contacts CT and the guard rings 111 and 112.

According to this embodiment, the page buffer 110 may not include a guard ring arranged in the upper edge region of the well region W, and accordingly, the size of the page buffer 110 in the first horizontal direction HD1 may be reduced compared to the size which may be achieved when guard rings are arranged in each of the upper edge region and the lower edge region of the well region W. Also, according to the embodiment, the page buffer 110 may not include guard rings arranged in the lateral edge regions of the well region W, and accordingly, the size of the page buffer 110 in the second horizontal direction HD2 may be reduced compared to the size which may be achieved when guard rings are arranged in each lateral edge region of the well region W. As a result, a chip size may be reduced by reducing the size of the peripheral circuit including the page buffer 110.

Figure 12:
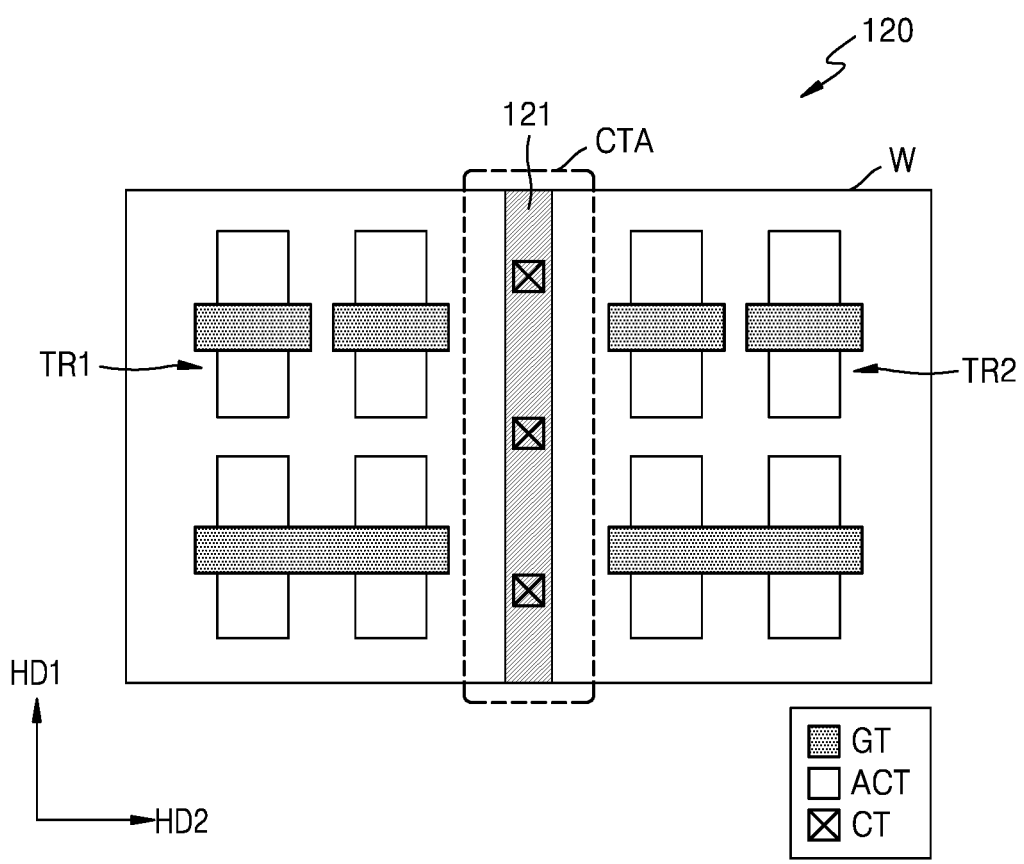

FIG. 12 is a planar view of a page buffer 120 according to an embodiment.

With reference to FIG. 12, the page buffer 120 may correspond to a part of the page buffer circuit region PGBUF of the second semiconductor layer L2 of FIG. 5. The page buffer 120 may include the first transistors TR1 and the second transistors TR2 arranged in the well region W, and further include a guard ring 121 extending in the first horizontal direction HD1. The guard ring 121 may be arranged in the common source line tapping area CTA between the first transistors TR1 and the second transistors TR2.

Compared to the page buffer 110 of FIG. 11, the page buffer 120 according to the embodiment may not include a guard ring extending in the second horizontal direction HD2. Accordingly, a size of the page buffer 120 in the first horizontal direction HD1 may be less than a size of the page buffer 110 of FIG. 11 in the first horizontal direction HD1. As a result, a chip size may be reduced by reducing the size of the peripheral circuit including the page buffer 120.

Figure 13:
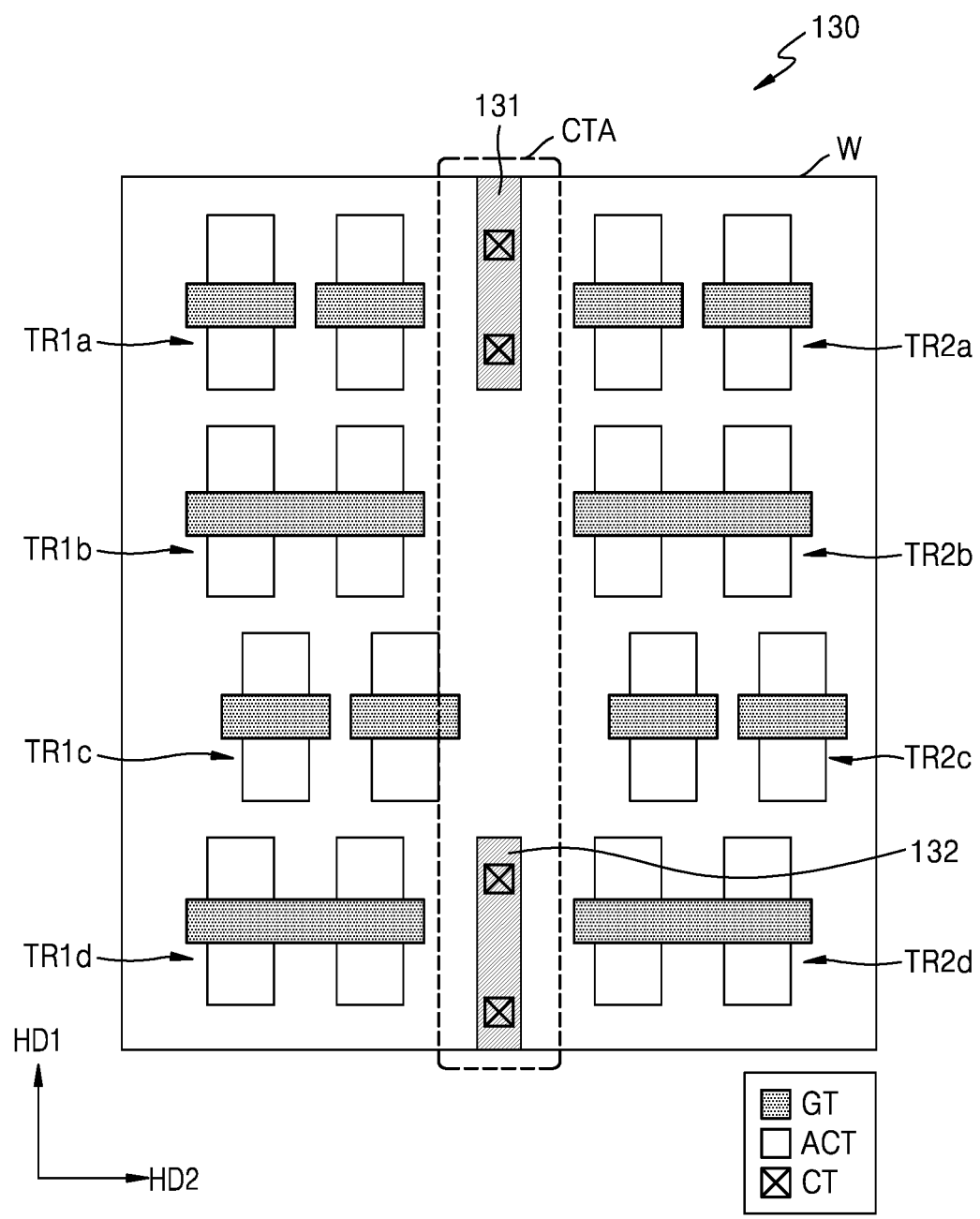

FIG. 13 is a planar view of a page buffer 130 according to an embodiment.

With reference to FIG. 13, the page buffer 130 may correspond to a part of the page buffer circuit region PGBUF of the second semiconductor layer L2 of FIG. 5. The page buffer 130 may include first transistors TR1a to TR1d and second transistors TR2a to TR2d arranged in the well region W, and further include guard rings 131 and 132 extending in the first horizontal direction HD1. The guard rings 131 and 132 may be arranged in the common source line tapping area CTA between the first transistors TR1 and the second transistors TR2. The guard rings 131 and 132 may be spaced apart from each other in the first horizontal direction HD1. In one embodiment, the guard rings 131 and 132 may be arranged in line, but the inventive concept is not limited thereto.

The first transistors TR1a to TR1d may not be aligned in the second horizontal direction HD2. For example, the first transistors TR1c may be offset in the second horizontal direction HD2 with respect to the first transistors TR1b, and may be offset in the second horizontal direction HD2 with respect to the first transistors TR1d. Similarly, the second transistors TR2a to TR2d may not be aligned in the second horizontal direction HD2. For example, the second transistors TR2c may be offset in the second horizontal direction HD2 with respect to the second transistors TR2b, and may be offset in the second horizontal direction HD2 with respect to the second transistors TR2d.

Accordingly, in this embodiment, in the common source line tapping area CTA, no guard ring may be arranged in an area between the first transistors TR1c and the second transistors TR2c. FIG. 13 illustrates that in the common source line tapping area CTA, no guard ring is arranged in an area between the first transistors TR1b and the second transistors TR2b, but the inventive concept is not limited thereto. In some embodiments, the guard ring 131 may extend to an area between the first transistors TR1b and the second transistors TR2b, or the guard ring 132 may extend to an area between the first transistors TR1c and the second transistors TR2c.

According to the embodiment, the page buffer 130 may not include guard rings arranged in the upper edge region and the lower edge region of the well region W, and accordingly, the size of the page buffer 130 in the first horizontal direction HD1 may be reduced compared to the size that may be achieved when guard rings are arranged in each of the upper edge region and the lower edge region of the well region W. Accordingly, in the embodiment, the page buffer 130 may not include guard rings arranged in the lateral edge regions of the well region W, and accordingly, the size of the page buffer 130 in the second horizontal direction HD2 may be reduced compared to the size that may be achieved when guard rings are arranged in each lateral edge region of the well region W. As a result, a chip size may be reduced by reducing the size of the peripheral circuit including the page buffer 130.

Figure 14:
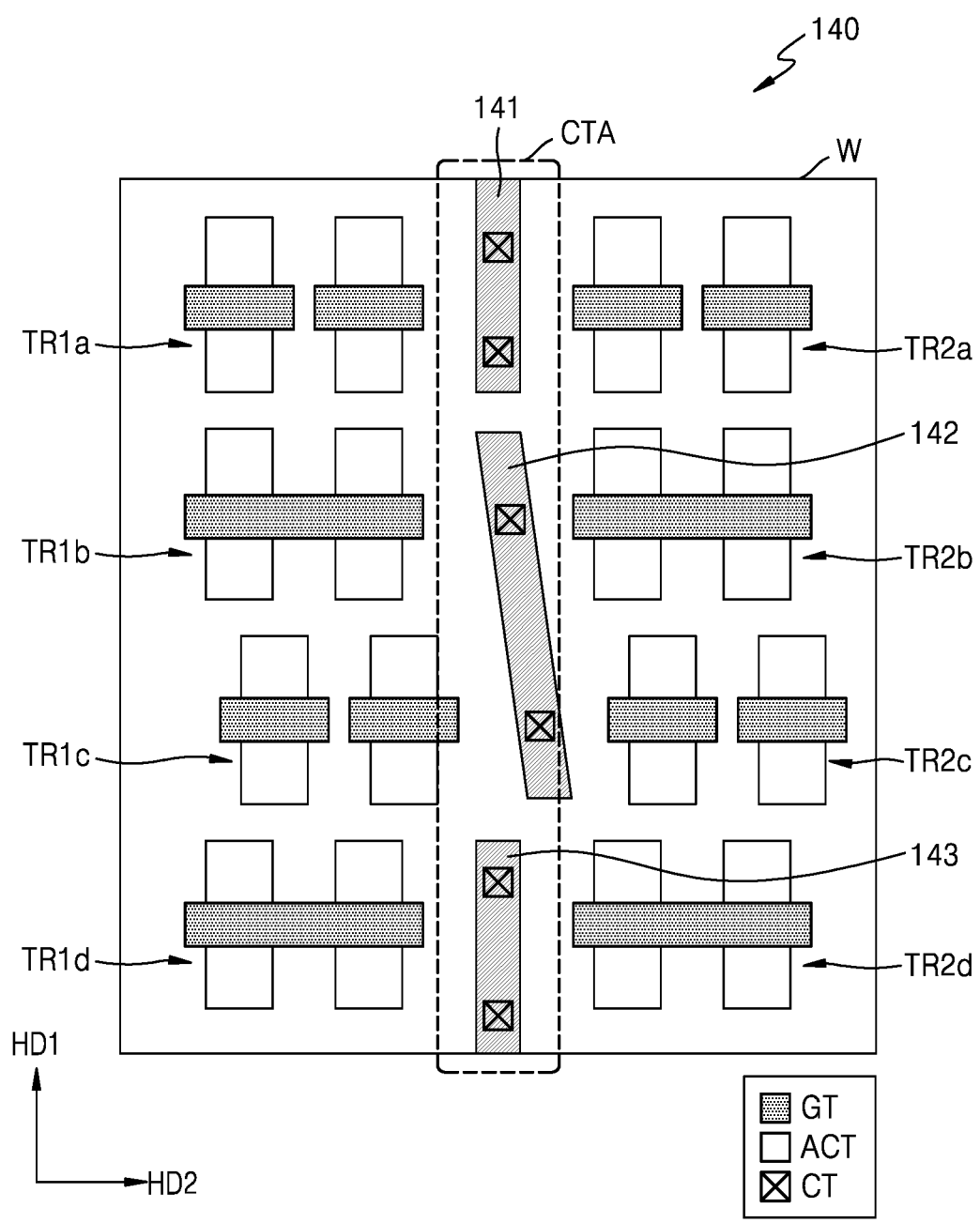

FIG. 14 is a planar view of a page buffer 140 according to an embodiment.

With reference to FIG. 14, the page buffer 140 may correspond to a part of the page buffer circuit region PGBUF of the second semiconductor layer L2 of FIG. 5. The page buffer 140 may correspond to a modification example of the page buffer 130 of FIG. 13, and thus, redundant descriptions thereon are omitted. The page buffer 140 may include first transistors TR1a to TR1d and second transistors TR2a to TR2d arranged in the well region W, and further include guard rings 141, 142, and 143 arranged between the first transistors TR1a to TR1d and the second transistors TR2a to TR2d. The guard rings 141, 142, and 143 may be spaced apart from each other in the first horizontal direction HD1 in the common source line tapping area CTA.

In this embodiment, the guard ring 142 may be arranged in a diagonal direction. For example, the guard ring 142 may be arranged to have a certain angle with respect to the second horizontal direction HD2. Specifically, the guard ring 142 may be arranged in an inclined manner according to an arrangement of an adjacent active region ACT and a gate electrode GT. In addition, the guard rings 141 and 143 may extend in the first horizontal direction HD1. For example, the guard rings 141 and 143 may be arranged in line, but the inventive concept is not limited thereto.

In some embodiments, some areas of at least one of the plurality of guard rings may extend outside the common source line tapping area CTA. For example, some areas of the guard ring 142 may be arranged in the common source line tapping area CTA, and the remaining areas of the guard ring 142 may be arranged outside the common source line tapping area CTA. At this time, parts of the guard ring 142 extending outside the common source line tapping area CTA may not be in contact with the second transistor TR2c.

Figure 15:
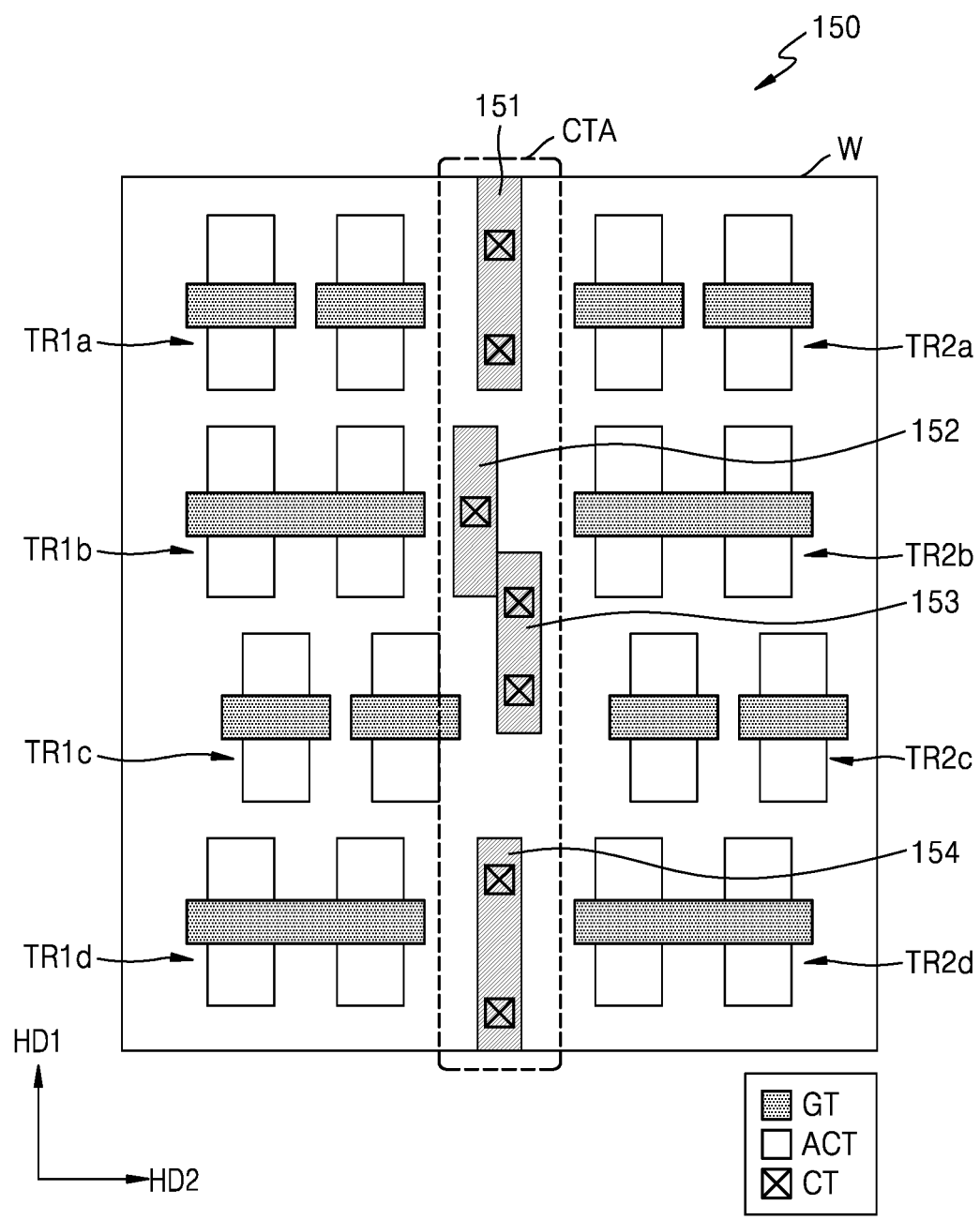

FIG. 15 is a planar view of a page buffer 150 according to an embodiment.

With reference to FIG. 15, the page buffer 150 may correspond to a part of the page buffer circuit region PGBUF of the second semiconductor layer L2 of FIG. 5. The page buffer 150 may correspond to a modification example of the page buffer 130 of FIG. 13, and thus, redundant descriptions thereon are omitted. The page buffer 150 may include first transistors TR1a to TR1d and second transistors TR2a to TR2d arranged in the well region W, and further include guard rings 151, 152, 153, and 154 arranged between the first transistors TR1a to TR1d and the second transistors TR2a to TR2d.

In this embodiment, the guard ring 152 may be arranged on the left of the common source line tapping area CTA, the guard ring 153 may be arranged on the right of the common source line tapping area CTA, and the guard rings 152 and 153 may be partially in contact with each other in the second horizontal direction HD2. In some embodiment, some areas of the guard rings 152 and 153 may overlap. Specifically, the guard rings 152 and 153 may be arranged to keep a certain distance from the adjacent active region ACT or the gate electrode GT. In addition, the guard rings 152 and 153 may extend in the first horizontal direction HD1. For example, the guard rings 152 and 153 may be arranged in line, but the inventive concept is not limited thereto.

Figure 16:
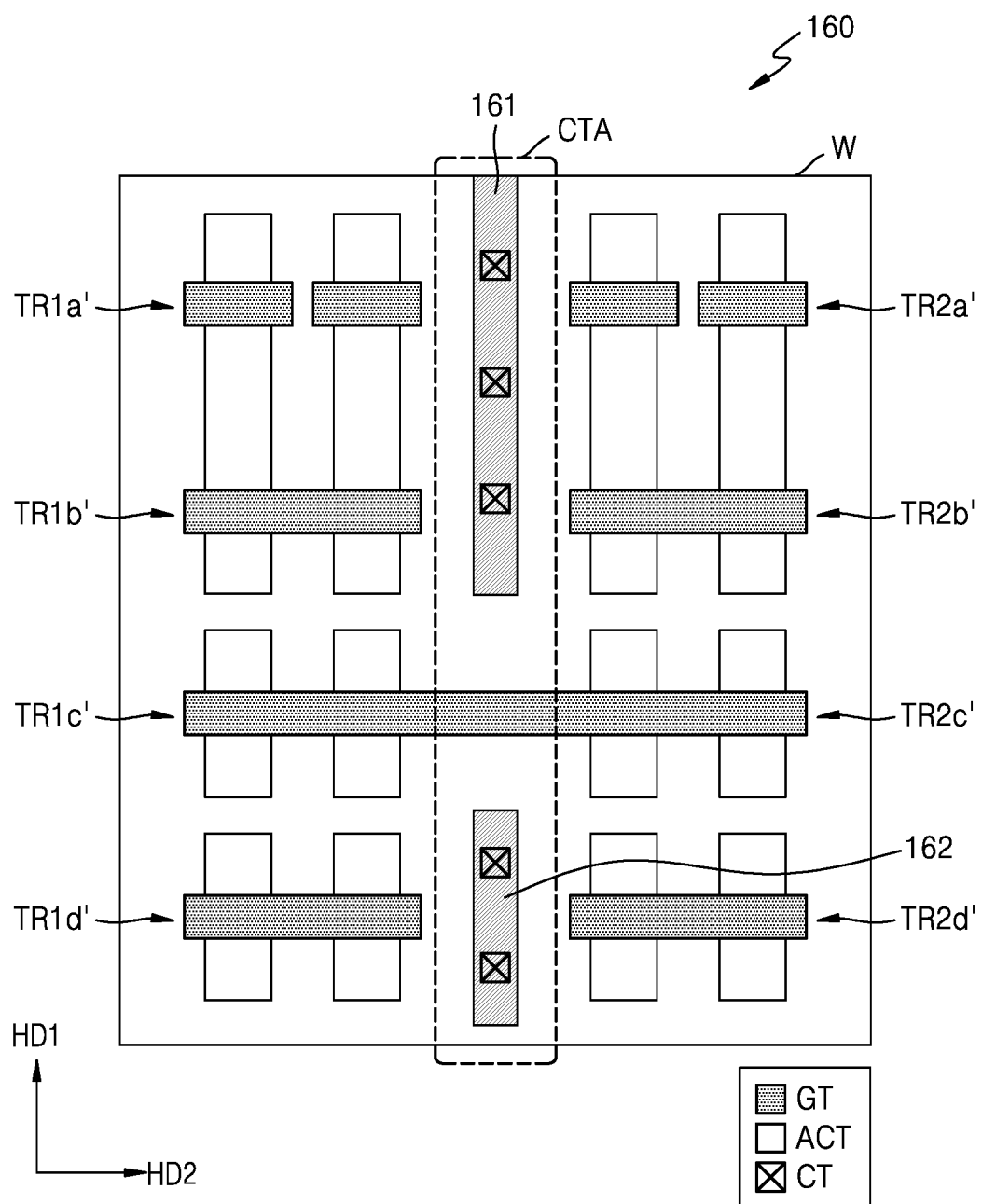

FIG. 16 is a planar view of a page buffer 160 according to an embodiment.

With reference to FIG. 16, the page buffer 160 may correspond to a part of the page buffer circuit region PGBUF of the second semiconductor layer L2 of FIG. 5. The page buffer 160 may include first transistors TR1*a'* to TR1*d'* and second transistors TR2*a'* to TR2*d'* arranged in the well region W, and further include guard rings 161 and 162 arranged between the first transistors TR1*a'* to TR1*d'* and the second transistors TR2*a'* to TR2*d'*.

In this embodiment, the gate electrode GT of the first and second transistors TR1*c'* and TR2*c'* may extend in the second horizontal direction HD2 across the common source line tapping area CTA. Accordingly, the guard ring 161 may extend in the first horizontal direction HD1 between the first transistors TR1*a'* and TR1*b'* and the second transistors TR2*a'* and TR2*b'*, and the guard ring 162 may extend in the first horizontal direction HD1 between the first transistors TR1*d'* and the second transistors TR2*d'*. For example, the guard rings 161 and 162 may be arranged in line, but the inventive concept is not limited thereto.

Figure 17:
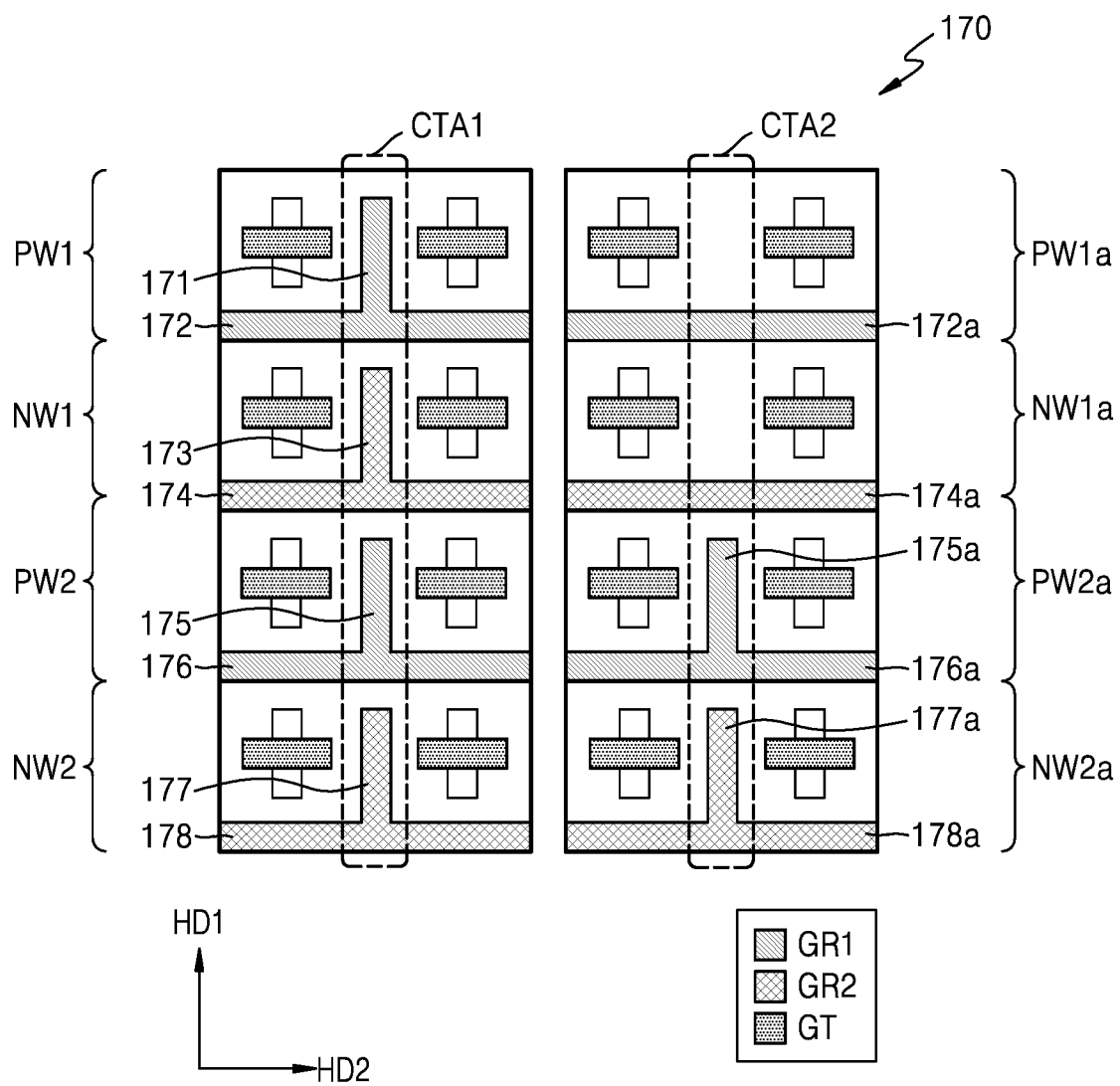

FIG. 17 is a planar view of a page buffer 170 according to an embodiment.

With reference to FIG. 17, the page buffer 170 may correspond to a part of the page buffer circuit region PGBUF of the second semiconductor layer L2 of FIG. 5. The page buffer 170 may include a plurality of well regions PW1, PW2, PW1*a*, PW2*a*, NW1, NW2, NW1*a*, and NW2*a*, and a plurality of transistors may be arranged in each of the plurality of well regions PW1, PW2, PW1*a*, PW2*a*, NW1, NW2, NW1*a*, and NW2*a*. The well regions PW1, NW1, PW2, and NW2 may be arranged in the first horizontal direction HD1, and the well regions PW1*a*, NW1*a*, PW2*a*, and NW2*a* may be arranged in the first horizontal direction HD1.

In the first common source line tapping area CTA1, guard rings 171, 173, 175, and 177 extending in the first horizontal direction HD1 may be arranged, and in the second common source line tapping area CTA2, guard rings 175*a* and 177*a* extending in the first horizontal direction HD1 may be arranged. As described above, according to the embodiment, some well regions PW1*a* and NW1*a* may not include guard rings extending in the first horizontal direction HD1.

Specifically, the well region PW1 may include the guard ring 171 extending in the first horizontal direction HD1 and a guard ring 172 extending in the second horizontal direction HD2. At this time, the guard rings 171 and 172 may be in contact with each other, but the inventive concept is not limited thereto. The well region NW1 may include the guard ring 173 extending in the first horizontal direction HD1 and a guard ring 174 extending in the second horizontal direction HD2. At this time, the guard rings 173 and 174 may be in contact with each other, but the inventive concept is not limited thereto. The well region PW2 may include the guard ring 175 extending in the first horizontal direction HD1 and a guard ring 176 extending in the second horizontal direction HD2. At this time, the guard rings 175 and 176 may be in contact with each other, but the inventive concept is not limited thereto. The well region NW2 may include the guard ring 177 extending in the first horizontal direction HD1 and a guard ring 178 extending in the second horizontal direction HD2. At this time, the guard rings 177 and 178 may be in contact with each other, but the inventive concept is not limited thereto.

The well region PW1*a* may include a guard ring 172*a* extending in the second horizontal direction HD2, and the well region NW1*a* may include a guard ring 174*a* extending in the second horizontal direction HD2. The well region PW2*a* may include the guard ring 175*a* extending in the first horizontal direction HD1 and a guard ring 176*a* extending in the second horizontal direction HD2. At this time, the guard rings 175*a* and 176*a* may be in contact with each other, but the inventive concept is not limited thereto. The well region NW2*a* may include the guard ring 177*a* extending in the first horizontal direction HD1 and a guard ring 178*a* extending in the second horizontal direction HD2. At this time, the guard rings 177*a* and 178*a* may be in contact with each other, but the inventive concept is not limited thereto.

Although a plurality of contacts CT arranged on the guard rings 171 to 178, 172*a*, and 174*a* to 178*a* are not shown in FIG. 17, at least one contact CT may be arranged on each of the guard rings 171 to 178, 172*a*, and 174*a* to 178*a*. In some examples, at least one contact CT may be arranged on each of the guard rings 172, 174, 176, 178, 172*a*, 174*a*, 176*a*, and 178*a* other than the guard rings 171, 173, 175, 177, 175*a*, and 177*a*.

Figure 18:
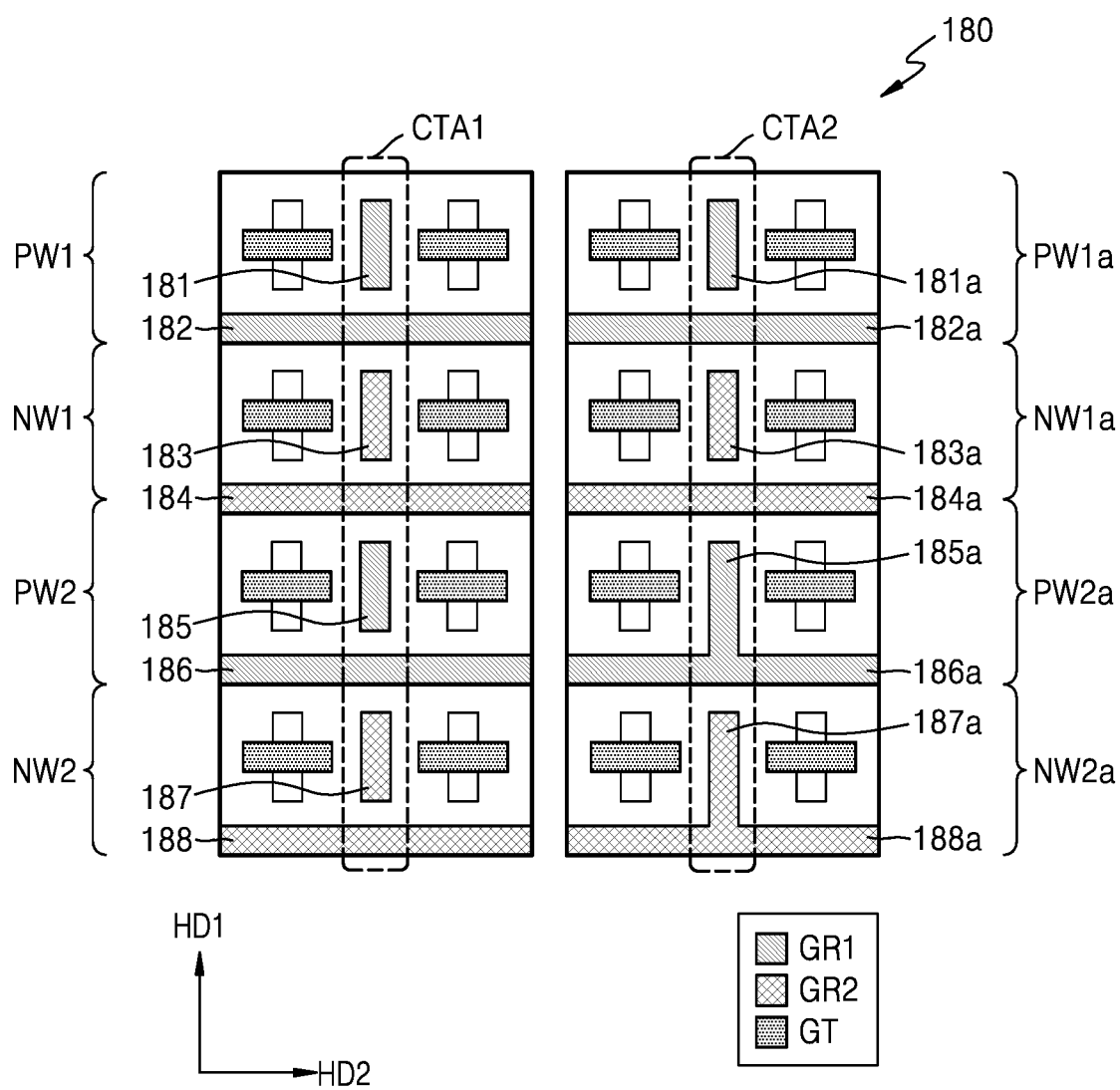

FIG. 18 is a planar view of a page buffer 180 according to an embodiment.

With reference to FIG. 18, the page buffer 180 may correspond to a part of the page buffer circuit region PGBUF of the second semiconductor layer L2 of FIG. 5. The page buffer 180 may include a plurality of well regions PW1, PW2, PW1*a*, PW2*a*, NW1, NW2, NW1*a*, and NW2*a*, and a plurality of transistors may be arranged in each of the plurality of well regions PW1, PW2, PW1*a*, PW2*a*, NW1, NW2, NW1*a*, and NW2*a*. The well regions PW1, NW1, PW2, and NW2 may be arranged in the first horizontal direction HD1, and the well regions PW1*a*, NW1*a*, PW2*a*, and NW2*a* may be arranged in the first horizontal direction HD1.

In the first common source line tapping area CTA1, guard rings 181, 183, 185, and 187 extending in the first horizontal direction HD1 may be arranged, and in the second common source line tapping area CTA2, guard rings 181*a*, 183*a*, 185*a*, and 187*a* extending in the first horizontal direction HD1 may be arranged. As such, according to the embodiment, the plurality of well regions PW1, PW2, PW1*a*, PW2*a*, NW1, NW2, NW1*a*, and NW2*a* may all include guard rings extending in the first horizontal direction HD1.

Specifically, the well region PW1 may include the guard ring 181 extending in the first horizontal direction HD1 and a guard ring 182 extending in the second horizontal direction HD2, and the guard rings 181 and 182 may be spaced apart from each other. The well region NW1 may include the guard ring 183 extending in the first horizontal direction HD1 and a guard ring 184 extending in the second horizontal direction HD2, and the guard rings 183 and 184 may be spaced apart from each other. The well region PW2 may include the guard ring 185 extending in the first horizontal direction HD1 and a guard ring 186 extending in the second horizontal direction HD2, and the guard rings 185 and 186 may be spaced apart from each other. The well region NW2 may include the guard ring 187 extending in the first horizontal direction HD1 and a guard ring 188 extending in the second horizontal direction HD2, and the guard rings 187 and 188 may be spaced apart from each other.

The well region PW1*a* may include the guard ring 181*a* extending in the first horizontal direction HD1 and a guard ring 182*a* extending in the second horizontal direction HD2, and the guard rings 181*a* and 182*a* may be spaced apart from each other. The well region NW1*a* may include the guard ring 183*a* extending in the first horizontal direction HD1 and a guard ring 184*a* extending in the second horizontal direction HD2, and the guard rings 183*a* and 184*a* may be spaced apart from each other. The well region PW2*a* may include the guard ring 185*a* extending in the first horizontal direction HD1 and a guard ring 186*a* extending in the second horizontal direction HD2, and the guard rings 185*a* and 186*a* may be in contact with each other. The well region NW2*a* may include the guard ring 187*a* extending in the first horizontal direction HD1 and a guard ring 188*a* extending in the second horizontal direction HD2, and the guard rings 187*a* and 188*a* may be in contact with each other.

Although a plurality of contacts CT arranged on the guard rings 181 to 188 and 181*a* to 188*a* are not shown in FIG. 18, at least one contact CT may be arranged on each of the guard rings 181 to 188 and 181*a* to 188*a*. In some examples, at least one contact CT may be arranged on each of the guard rings 181 to 188, 181*a* to 184*a*, 186*a*, and 188*a* other than the guard rings 185*a* and 187*a*.

Figure 19:
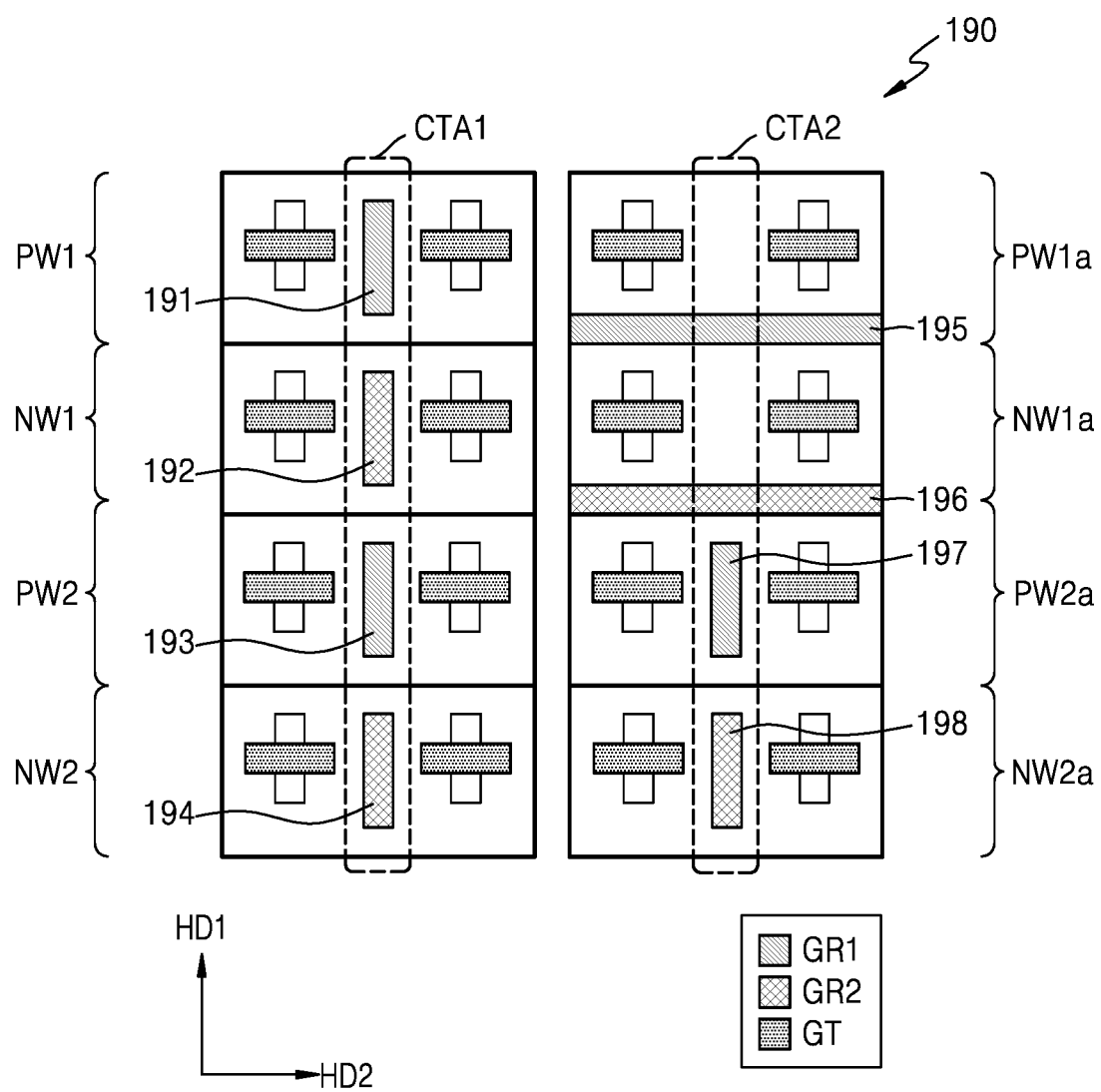

FIG. 19 is a planar view of a page buffer 190 according to an embodiment.

With reference to FIG. 19, the page buffer 190 may correspond to a part of the page buffer circuit region PGBUF of the second semiconductor layer L2 of FIG. 5. The page buffer 190 may include a plurality of well regions PW1, PW2, PW1*a*, PW2*a*, NW1, NW2, NW1*a*, and NW2*a*, and a plurality of transistors may be arranged in each of the plurality of well regions PW1, PW2, PW1*a*, PW2*a*, NW1, NW2, NW1*a*, and NW2*a*. The well regions PW1, NW1, PW2, and NW2 may be arranged in the first horizontal direction HD1, and the well regions PW1*a*, NW1*a*, PW2*a*, and NW2*a* may be arranged in the first horizontal direction HD1.

In the first common source line tapping area CTA1, guard rings 191, 192, 193, and 194 extending in the first horizontal direction HD1 may be arranged, and in the second common source line tapping area CTA2, guard rings 197 and 198 extending in the first horizontal direction HD1 may be arranged. As described above, according to the embodiment, some well regions PW1*a* and NW1*a* may not include guard rings extending in the first horizontal direction HD1, and instead may respectively include guard rings 195 and 196 extending in the second horizontal direction HD2. Meanwhile, some well regions PW1, NW1, PW2, NW2, PW2*a*, and NW2*a* may not include guard rings extending in the second horizontal direction HD2.

Although a plurality of contacts CT arranged on the guard rings 191 to 198 are not shown in FIG. 19, at least one contact CT may be arranged on each of the guard rings 191 to 198.

Figure 20:
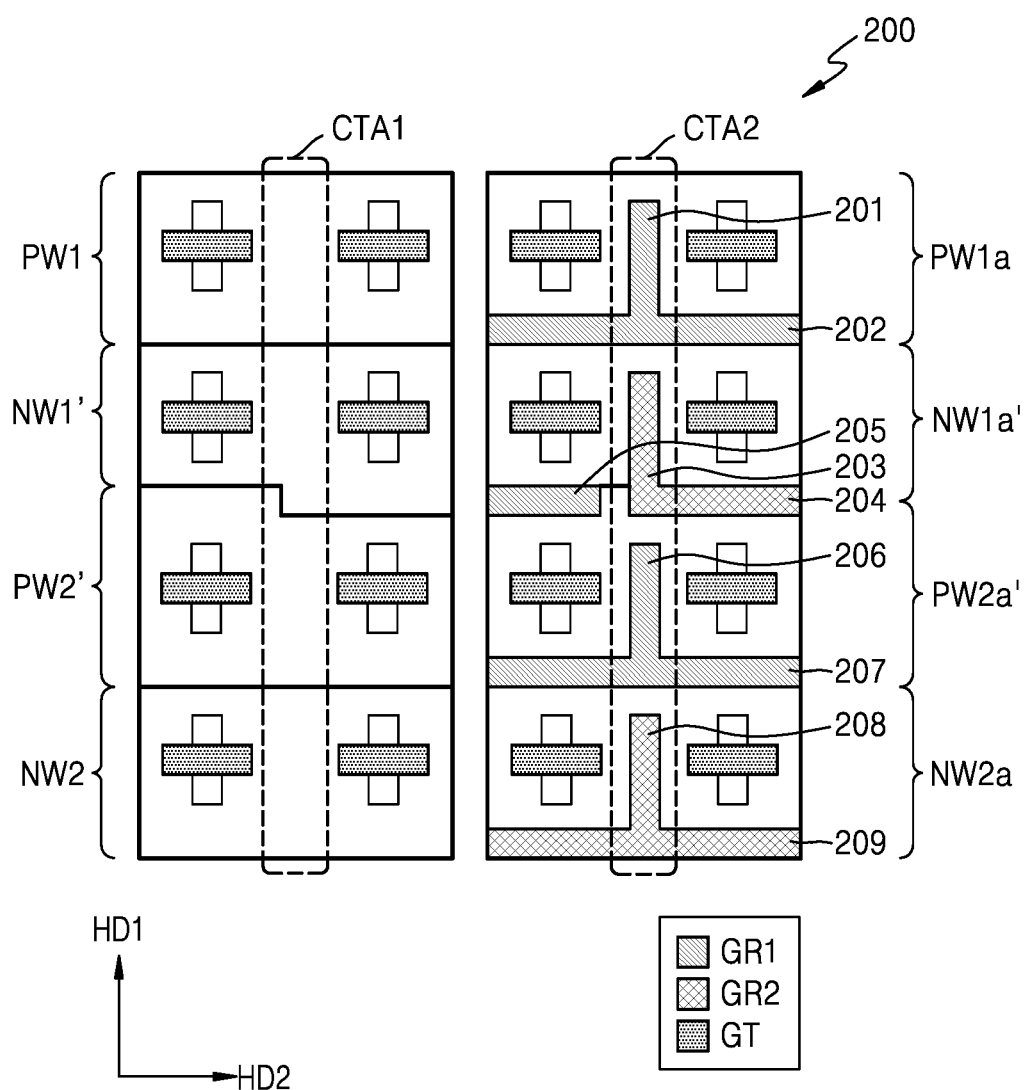

FIG. 20 is a planar view of a page buffer 200 according to an embodiment.

With reference to FIG. 20, the page buffer 200 may correspond to a part of the page buffer circuit region PGBUF of the second semiconductor layer L2 of FIG. 5. The page buffer 200 may include a plurality of well regions PW1, PW2', PW1*a*, PW2*a'*, NW1', NW2, NW1*a'*, and NW2*a*, and a plurality of transistors may be arranged in each of the plurality of well regions PW1, PW2', PW1*a*, PW2*a'*, NW1', NW2, NW1*a'*, and NW2*a*. The well regions PW1, NW1', PW2', and NW2 may be arranged in the first horizontal direction HD1, and the well regions PW1*a*, NW1*a'*, PW2*a'*, and NW2*a* may be arranged in the first horizontal direction HD1.

In this embodiment, some well regions NW1', PW2', NW1*a'*, and PW2*a'* may be formed in L-shape. For example, each of some well regions NW1', PW2', NW1*a'*, and PW2*a'* may be formed in the shape with one edge region bent. At this time, guard rings 201, 203, 206, and 208 extending in the first horizontal direction HD1 may be arranged in the second common source line tapping area CTA2. Although it is not shown in the drawings, guard rings extending in the first horizontal direction HD1 may be arranged in the first common source line tapping area CTA1, similarly to the second common source line tapping area CTA2.

The well region PW1*a* may include the guard ring 201 extending in the first horizontal direction HD1 and a guard ring 202 extending in the second horizontal direction HD2. At this time, the guard rings 201 and 202 may be in contact with each other, thereby forming an upside-down T shape. The well region NW1*a'* may include the guard ring 203 extending in the first horizontal direction HD1 and a guard ring 204 extending in the second horizontal direction HD2. At this time, the guard rings 203 and 204 may be in contact with each other, thereby forming an L shape. The well region PW2*a'* may include the guard ring 206 extending in the first horizontal direction HD1 and guard rings 205 and 207 extending in the second horizontal direction HD2. At this time, the guard ring 205 may be arranged in an upper edge region, the guard ring 207 may be arranged in a lower edge region, and the guard rings 206 and 207 may be in contact with each other, thereby forming an upside-down T shape. The well region NW2*a* may include the guard ring 208 extending in the first horizontal direction HD1 and a guard ring 209 extending in the second horizontal direction HD2. At this time, the guard rings 208 and 209 may be in contact with each other, thereby forming an upside-down T shape.

FIG. 20 omits the guard rings in the left well regions PW1, NW1', PW2', and NW2 to clearly show the well regions having a bent shape. However, guard rings extending in the first horizontal direction HD1, guard rings extending in the second horizontal direction HD2, guard rings having the upside-down T shape, T-shaped guard rings, L-shaped guard rings, or guard rings having the upside-down L shape, etc. may be arranged in the left well regions PW1, NW1', PW2', and NW2, similarly to the right well regions PW1*a*, NW1*a*, PW2*a*, and NW2*a*.

Although a plurality of contacts CT arranged on the guard rings 201 to 209 are not shown in FIG. 20, at least one contact CT may be arranged on each of the guard rings 201 to 209. In some examples, at least one contact CT may be arranged on each of the guard rings 202, 204, 205, 207, and 209 other than the guard rings 201, 203, 206, and 208.

Figure 21:
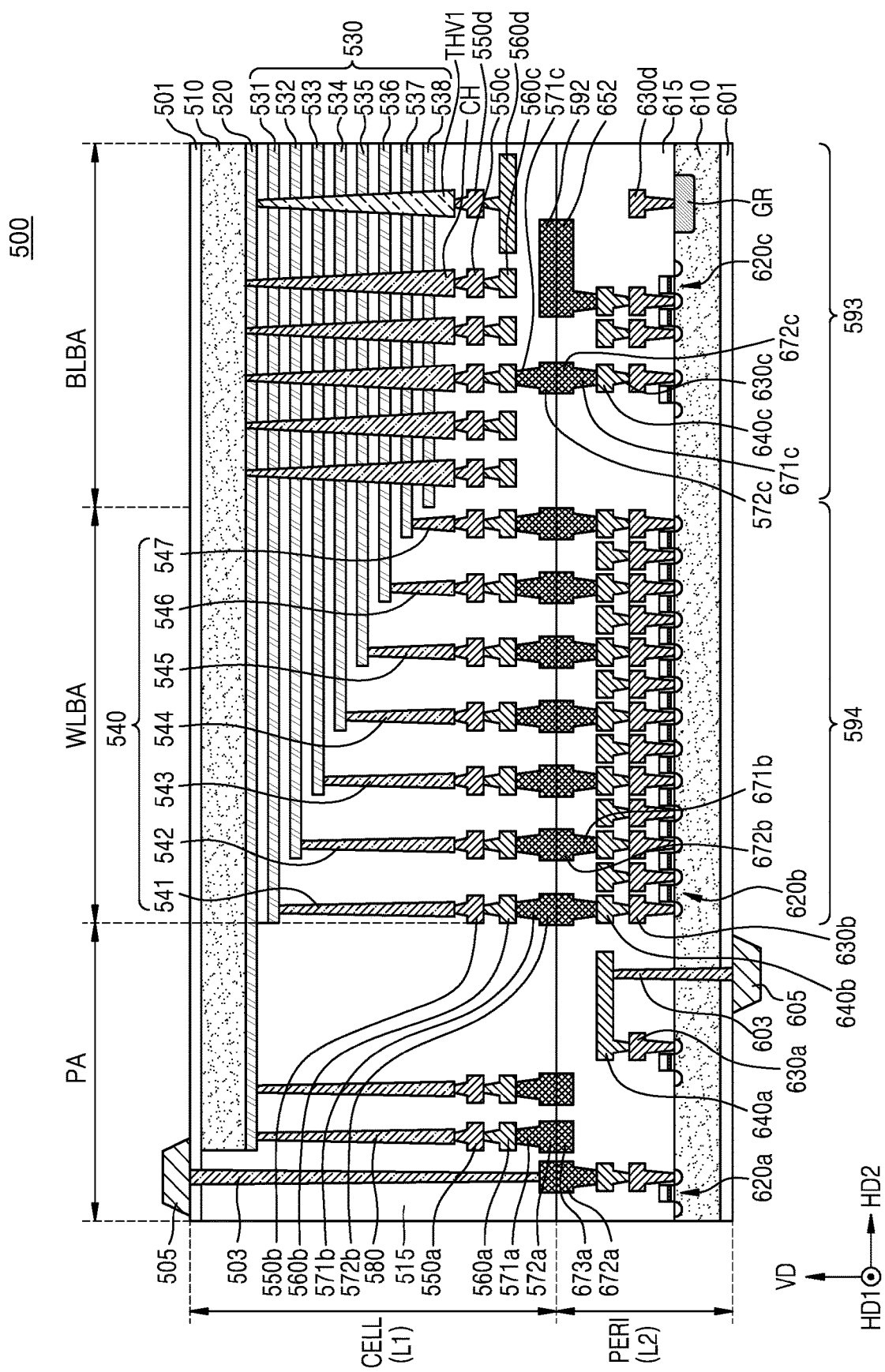
FIG. 21 is a cross-sectional diagram of a memory device having a bonding vertical NAND (B-VNAND) structure according to an embodiment.

FIG. 21 is a cross-sectional diagram of a memory device having a bonding vertical NAND (B-VNAND) structure according to an embodiment. When non-volatile memory included in the memory device is implemented as B-VNAND type flash memory, the non-volatile memory may have the structure shown in FIG. 21. Referring to FIG. 21, a memory device 500 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner For example, the bonding manner may include a method of electrically connecting a bonding metal (or a metal pad) formed on an uppermost metal layer of the upper chip and a bonding metal (or a metal pad) formed on an uppermost metal layer of the lower chip. For example, the bonding metal may include a copper (Cu) for Cu-to-Cu bonding. However, the invention is not limited thereto. For example, the bonding metal may be formed of aluminum (Al) or tungsten (W).

With reference to FIG. 21, the cell region CELL of the memory device 500 may correspond to the first semiconductor layer L1 of FIGS. 4, 5, 7, and 10, and the peripheral circuit region PERI may correspond to the second semiconductor layer L2 of FIGS. 4, 5, 7, and 10. The peripheral circuit region PERI and the cell region CELL of the memory device 500 may respectively include an external pad bonding area PA, a word line bonding area WLBA, and a bit line bonding area BLBA.

The peripheral circuit region PERI may include a first substrate 610, an interlayer insulating layer 615, a plurality of circuit elements 620*a*, 620*b*, and 620*c* formed on the first substrate 610, first metal layers 630*a*, 630*b*, and 630*c* respectively connected to the plurality of circuit elements 620*a*, 620*b*, and 620*c*, and second metal layers 640*a*, 640*b*, and 640*c* formed on the first metal layers 630*a*, 630*b*, and 630*c*. Each of the circuit elements 620*a*, 620*b*, and 620*c* may include one or more transistors. In an example embodiment, the first metal layers 630*a*, 630*b*, and 630*c* may be formed of tungsten having relatively high resistivity, and the second metal layers 640*a*, 640*b*, and 640*c* may be formed of copper having relatively low resistivity.

In an example embodiment, although only the first metal layers 630*a*, 630*b*, and 630*c* and the second metal layers 640*a*, 640*b*, and 640*c* are shown and described, the invention is not limited thereto, and one or more additional metal layers may be further formed on the second metal layers 640*a*, 640*b*, and 640*c*. At least a portion of the one or more additional metal layers formed on the second metal layers 640*a*, 640*b*, and 640*c* may be formed of aluminum or the like having a lower resistivity than those of copper forming the second metal layers 640*a*, 640*b*, and 640*c*.

The interlayer insulating layer 615 may be disposed on the first substrate 610 and cover the plurality of circuit elements 620*a*, 620*b*, and 620*c*, the first metal layers 630*a*, 630*b*, and 630*c*, and the second metal layers 640*a*, 640*b*, and 640*c*. The interlayer insulating layer 615 may include an insulating material such as silicon oxide, silicon nitride, or the like.

Lower bonding metals 671*b* and 672*b* may be formed on the second metal layer 640*b* in the word line bonding area WLBA. In the word line bonding area WLBA, the lower bonding metals 671*b* and 672*b* in the peripheral circuit region PERI may be electrically bonded to upper bonding metals 571*b* and 572*b* of the cell region CELL. The lower bonding metals 671*b* and 672*b* and the upper bonding metals 571*b* and 572*b* may be formed of aluminum, copper, tungsten, or the like. Further, the upper bonding metals 571*b* and 572*b* in the cell region CELL may be referred as first metal pads and the lower bonding metals 671*b* and 672*b* in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in the vertical direction VD, perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550*c* and a second metal layer 560*c*. For example, the first metal layer 550*c* may be a bit line contact, and the second metal layer 560*c* may be a bit line BL. In an example embodiment, the second metal layer 560*c*, that is, the bit line BL may extend in a first horizontal direction HD1, parallel to the upper surface of the second substrate 510.

In an example embodiment, an area in which the channel structure CH, the bit line 560*c*, and the like are disposed may be defined as the bit line bonding area BLBA. In the bit line bonding area BLBA, the bit line 560*c* may be electrically connected to the circuit elements 620*c* providing a page buffer 593 in the peripheral circuit region PERI. The page buffer 593 may correspond to the page buffer circuit 210 of FIG. 1. The bit line 560*c* may be connected to upper bonding metals 571*c* and 572*c* in the cell region CELL, and the upper bonding metals 571*c* and 572*c* may be connected to lower bonding metals 671*c* and 672*c* connected to the circuit elements 620*c* of the page buffer 593.

In one embodiment, the bit line bonding area BLBA may further include a common source line tapping wire 560*d* arranged at the same level as the bit line 560*c*. The common source line tapping wire 560*d* may extend in the first horizontal direction HD1. A size of the common source line tapping wire 560*d* in a second horizontal direction HD2 may be greater than a size of the bit line 560*c* in the second horizontal direction HD2. In one embodiment, the memory device 500 may further include the through electrode THV1 arranged in the bit line bonding area BLBA. The through electrode THV1 may extend in the vertical direction VD passing through the word lines 530. The common source line tapping wire 560*d* may be connected to the common source line 520 via the through electrode THV1.

In one embodiment, the page buffer 593 may include the guard ring GR extending in the first horizontal direction HD1. The guard ring GR may correspond to one of the guard rings disclosed above. The guard ring GR may be arranged below the common source line tapping wire 560*d* in the vertical direction VD. A first metal layer 630*d* may be arranged on the guard ring GR, and through the first metal layer 630*d* and the guard ring GR, a well bias voltage may be applied to a well region of the page buffer 593.

In the word line bonding area WLBA, the plurality of word lines 530 may extend in the second horizontal direction HD2, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second horizontal direction HD2. A first metal layer 550*b* and a second metal layer 560*b* may be connected to an upper portion of the plurality of cell contact plugs 540 connected to the plurality of word lines 530, sequentially. The plurality of cell contact plugs 540 may be connected to the peripheral circuit region PERI by the upper bonding metals 571*b* and 572*b* of the cell region CELL and the lower bonding metals 671*b* and 672*b* of the peripheral circuit region PERI in the word line bonding area WLBA.

The plurality of cell contact plugs 540 may be electrically connected to the circuit elements 620*b* providing a row decoder 594 in the peripheral circuit region PERI. The row decoder 594 may correspond to the row decoder 240 of FIG. 1. In an example embodiment, operating voltages of the circuit elements 620*b* of the row decoder 594 may be different from operating voltages of the circuit elements 620*c* providing the page buffer 593. For example, operating voltages of the circuit elements 620*c* providing the page buffer 593 may be greater than operating voltages of the circuit elements 620*b* providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

First and second input-output pads 605 and 505 may be disposed in the external pad bonding area PA. A lower insulating film 601 covering a lower surface of the first substrate 610 may be formed below the first substrate 610, and the first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and the second input-output pad 505 may be disposed on the upper insulating layer 501. The second input-output pad 505 may be connected to at least one of the plurality of circuit elements 620a, 620b, and 620c disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer 515 and the upper insulating film 501 of the cell region CELL to be connected to the second input-output pad 505.

According to embodiments, the first input-output pad 605 and the second input-output pad 505 may be selectively formed. For example, the memory device 500 may include only the first input-output pad 605 disposed on the first substrate 610 or the second input-output pad 505 disposed on the second substrate 510. Alternatively, the memory device 500 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

In an embodiment, the memory device 500 of FIG. 21 may be one of the memory device 10 described with reference to FIG. 1. For example, the cell region CELL may correspond to the memory cell array 100 of FIG. 1, and the peripheral circuit region PERI may correspond to at least one of the row decoder 240, the voltage generator 230, the page buffer circuit 210, and the control logic circuit 220 of FIG. 1.

Figure 22:
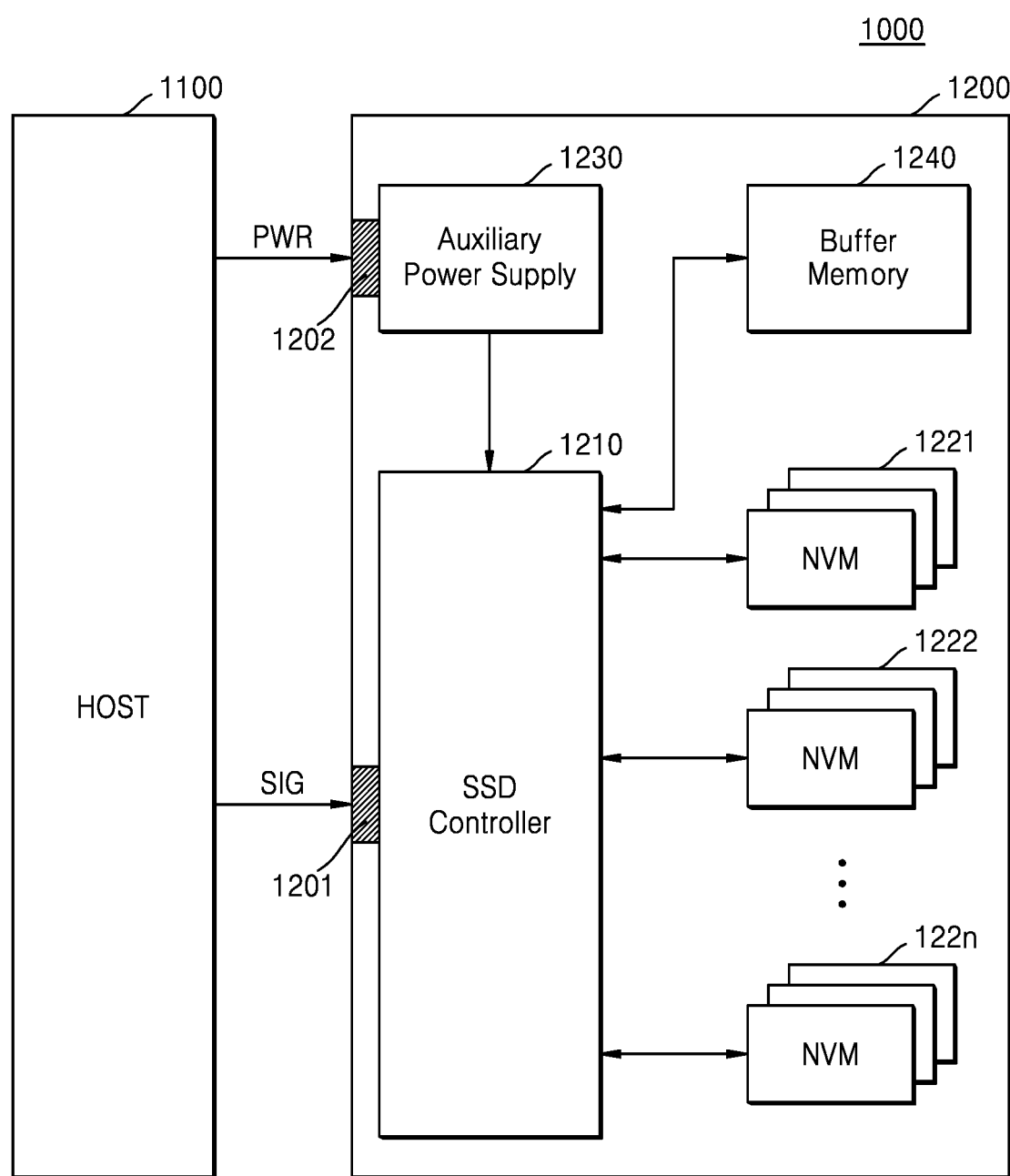
FIG. 22 is a block diagram of a solid state drive (SSD) system employing a memory device according to an embodiment.

FIG. 22 is a block diagram of a solid state drive (SSD) system 1000 employing a memory device according to an embodiment.

With reference to FIG. 22, the SSD system 1000 may include a host 1100 and an SSD 1200. The SSD 1200 may send and receive signals with the host 1100, and may be provided with power from a power connector. The SSD 1200 may include an SSD controller 1210, an auxiliary power device 1220, and memory devices 1221, 1222, . . . , and 122n (n is a positive integer). Each of the memory devices 1221, 1222, . . . , and 122n may be a vertically stacked NAND flash memory device. The SSD 1200 may be implemented by using the embodiments described above with reference to FIGS. 1, 2, 3A, 3B, and 4 to 21.

While the present disclosure has been particularly shown and described with reference to embodiments thereof, it will be understood that various changes in form and details may be made therein without departing from the spirit and scope of the following claims.

What is claimed is:
1. A non-volatile memory device comprising:
a memory cell region including first channel structures, second channel structures, first bit lines connected to the first channel structures, the first bit lines extending in a first direction, and the first bit lines being adjacent to each other in a second direction, second bit lines connected to the second channel structures, the second bit lines extending in the first direction, and the second bit lines being adjacent to each other in the second direction, a metal pattern extending in the first direction between the first bit lines and the second bit lines, and a first metal pad; and
a peripheral circuit region including a page buffer circuit and a second metal pad, and connected to the memory cell region in a vertical direction by the first metal pad and the second metal pad, wherein the page buffer circuit includes:
first transistors arranged below the first bit lines in the vertical direction and electrically connected to the first bit lines,
second transistors arranged below the second bit lines in the vertical direction and electrically connected to the second bit lines,
a first guard ring arranged below and overlapped the metal pattern in the vertical direction, extending in the first direction, and applied with a bias voltage, and
a second guard ring extending in the second direction and applied with the bias voltage.

2. The non-volatile memory device of claim 1, wherein the first guard ring and the second guard ring are connected to each other.

3. The non-volatile memory device of claim 1, wherein the first guard ring and the second guard ring are spaced apart from each other.

4. The non-volatile memory device of claim 1, wherein the first guard ring includes an active region formed in a well having a first conductivity type, and the active region having the first conductivity type, and
wherein the well is applied with the bias voltage through a contact electrically connected to the active region.

5. The non-volatile memory device of claim 1, wherein the first guard ring includes a plurality of active regions having a first conductivity type formed in a well having the first conductivity type, and the plurality of active regions spaced apart from each other in the first direction, and
wherein the well is applied with the bias voltage through contacts electrically connected to the plurality of active regions of the first conductivity type.

6. The non-volatile memory device of claim 1, wherein the first channel structures and second channel structures include a plurality of cell strings between the first and second bit lines and a common source line,
wherein the metal pattern corresponds to a common source line tapping wire, and
wherein the common source line tapping wire is electrically connected to the common source line.

7. The non-volatile memory device of claim 1, wherein the memory cell region is formed in a first wafer, and
wherein the peripheral circuit region is formed in a second wafer.

8. The non-volatile memory device of claim 1, wherein the first metal pad and the second metal pad are connected in a bonding manner.

9. The non-volatile memory device of claim 1, wherein the page buffer circuit is arranged in a page buffer circuit region of the peripheral circuit region.

10. A non-volatile memory device comprising:
a memory cell region including a plurality of cell strings and a first metal layer, the first meal layer including a plurality of metal lines extending in a first direction, the plurality of metal lines including first bit lines adjacent to each other in a second direction, second bit lines adjacent to each other in the second direction, and a common source line tapping wire between the first bit lines and the second bit lines; and
a page buffer circuit arranged below the memory cell region in a vertical direction,
wherein the page buffer circuit includes a first guard ring arranged below and overlapped the common source line tapping wire in the vertical direction and extending in the first direction,
wherein each of the plurality of cell strings has a plurality of memory cells, wherein the plurality of cell strings are disposed between the first and second bit lines and a common source line, and
wherein the common source line tapping wire is electrically connected to the common source line.

11. The non-volatile memory device of claim 10, wherein the memory cell region further includes:
a first cell region in which a plurality of first channel structures are arranged;
a second cell region in which a plurality of second channel structures are arranged; and
a cut-off region between the first cell region and the second cell region, and
wherein the first bit lines and the second bit lines are electrically connected to the page buffer circuit through a plurality of through electrodes arranged in the cut-off region.

12. The non-volatile memory device of claim 11, wherein the common source line tapping wire is connected to the common source line through a plurality of through electrodes arranged in the first cell region and the second cell region.

13. The non-volatile memory device of claim 10, wherein the first guard ring is applied with a bias voltage.

14. A non-volatile memory device comprising:
a memory cell region including first channel structures, second channel structures, first bit lines connected to the first channel structures, the first bit lines extending in a first direction, and the first bit lines being adjacent to each other in a second direction, second bit lines connected to the second channel structures, the second bit lines extending in the first direction, and the second bit lines being adjacent to each other in the second direction, a metal pattern extending in the first direction between the first bit lines and the second bit lines, and a first metal pad; and
a peripheral circuit region including a page buffer circuit and a second metal pad, and connected to the memory cell region in a vertical direction by the first metal pad and the second metal pad,
wherein the page buffer circuit includes:
first transistors arranged below the first bit lines in the vertical direction and electrically connected to the first bit lines,
second transistors arranged below the second bit lines in the vertical direction and electrically connected to the second bit lines, and
a first guard ring arranged below and overlapped the metal pattern in the vertical direction and arranged in a diagonal direction.

15. The non-volatile memory device of claim 14, wherein first guard ring is arranged in an inclined manner according to an arrangement of an adjacent active region and a gate electrode of at least one of the first transistors and the second transistors.

16. The non-volatile memory device of claim 14, wherein the first guard ring is arranged to have an angle with respect to the second direction.

17. The non-volatile memory device of claim 16, wherein the angle is between 45 and 90 degrees.

18. The non-volatile memory device of claim 14, wherein the page buffer circuit further includes a second guard ring arranged below the metal pattern in the vertical direction and extending in the first direction, and
wherein the first and second guard rings are apart from each other in the first direction.

19. The non-volatile memory device of claim 18, wherein the page buffer circuit further includes a third guard ring arranged below the metal pattern in the vertical direction and extending in the first direction, and
wherein the second and third guard rings are partially in contact with each other in the second direction.

20. The non-volatile memory device of claim 14, wherein the first guard ring is applied with a bias voltage.

\* \* \* \* \*